US011410853B2

United States Patent
Higuchi et al.

(10) Patent No.: US 11,410,853 B2
(45) Date of Patent: Aug. 9, 2022

(54) SUBSTRATE PROCESSING METHOD AND SUBSTRATE PROCESSING DEVICE

(71) Applicant: SCREEN Holdings Co., Ltd., Kyoto (JP)

(72) Inventors: Ayumi Higuchi, Kyoto (JP); Yuya Akanishi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/810,850

(22) Filed: Mar. 6, 2020

(65) Prior Publication Data

US 2020/0303207 A1 Sep. 24, 2020

(30) Foreign Application Priority Data

Mar. 20, 2019 (JP) .............................. JP2019-053346

(51) Int. Cl.
| | |
|---|---|
| *H01L 21/321* | (2006.01) |
| *H01L 21/3213* | (2006.01) |
| *H01L 21/306* | (2006.01) |
| *H01L 21/67* | (2006.01) |

(52) U.S. Cl.
CPC .. *H01L 21/32134* (2013.01); *H01L 21/30604* (2013.01); *H01L 21/6708* (2013.01); *H01L 21/67023* (2013.01); *H01L 21/67086* (2013.01); *H01L 21/67253* (2013.01)

(58) Field of Classification Search
CPC ......... H01L 21/32134; H01L 21/30604; H01L 21/67253; H01L 21/67023; H01L 21/67086; H01L 21/6708; H01L 21/67028; H01L 21/67138; H01L 21/76892; H01L 21/67017

See application file for complete search history.

(56) References Cited

U.S. PATENT DOCUMENTS

| | | | |
|---|---|---|---|
| 8,597,461 B2 | 12/2013 | Mayer et al. | |
| 9,074,287 B2 | 7/2015 | Mayer et al. | |
| 9,543,148 B1 | 1/2017 | Hudson et al. | |

(Continued)

FOREIGN PATENT DOCUMENTS

| | | |
|---|---|---|
| JP | 2018046279 | 3/2018 |
| KR | 1020160113014 | 9/2016 |

(Continued)

*Primary Examiner* — Duy Vu N Deo
(74) *Attorney, Agent, or Firm* — JCIPRNET

(57) ABSTRACT

The substrate processing method includes alternately performing a plurality of times of a metal oxide layer forming process in which an oxidation fluid is supplied to a surface of the substrate and a metal oxide layer composed of a one-atom layer or a several-atom layer is formed on a surface layer of the metal layer; and a metal oxide layer removal process in which an etching solution is supplied to the surface of the substrate and the metal oxide layer is removed from the surface of the substrate. A final dissolved oxygen concentration which is a dissolved oxygen concentration in the etching solution supplied to the surface of the substrate in a final metal oxide layer removal process is lower than an initial dissolved oxygen concentration which is a dissolved oxygen concentration in the etching solution supplied to the substrate in an initial metal oxide layer removal process.

19 Claims, 24 Drawing Sheets

(56) References Cited

U.S. PATENT DOCUMENTS

| | | |
|---|---|---|
| 10,068,764 B2 | 9/2018 | Tapily et al. |
| 10,256,108 B2 | 4/2019 | Fischer et al. |
| 10,431,458 B2 | 10/2019 | Hudson et al. |
| 10,566,187 B2 | 2/2020 | Qian et al. |
| 10,784,118 B2 | 9/2020 | Fischer et al. |
| 11,101,129 B2 | 8/2021 | Qian et al. |
| 2003/0148619 A1* | 8/2003 | Tsai ................. H01L 21/31111 438/704 |
| 2011/0061812 A1 | 3/2011 | Ganguly et al. |
| 2016/0293447 A1 | 10/2016 | Iwasaki et al. |
| 2016/0348265 A1* | 12/2016 | Mayer ..................... C25B 15/08 |
| 2017/0125340 A1 | 5/2017 | Tsai et al. |
| 2018/0076132 A1 | 3/2018 | Tsai et al. |
| 2019/0096721 A1* | 3/2019 | Iwasaki ............. H01L 21/67017 |
| 2020/0152446 A1 | 5/2020 | Qian et al. |
| 2020/0157693 A1* | 5/2020 | Abel ...................... C23C 22/02 |
| 2021/0343520 A1 | 11/2021 | Qian et al. |

FOREIGN PATENT DOCUMENTS

| | | |
|---|---|---|
| KR | 1020170028259 | 3/2017 |
| TW | 201129720 | 9/2011 |
| TW | 201203351 | 1/2012 |
| TW | 201727745 | 8/2017 |
| TW | 201738954 | 11/2017 |
| WO | 2013015559 | 1/2013 |
| WO | 2018004649 | 1/2018 |

* cited by examiner

SUBSTRATE PROCESSING METHOD AND SUBSTRATE PROCESSING DEVICE

CROSS REFERENCE TO RELATED APPLICATIONS

This application claims the priority benefit of Japanese Patent Application No. 2019-053346, filed Mar. 20, 2019. The entirety of the above-mentioned patent application is hereby incorporated by reference herein and made a part of this specification.

BACKGROUND

1. Field of the Invention

The disclosure relates to a substrate processing method and a substrate processing device for processing a substrate. Examples of substrates to be processed include flat panel display (FPD) substrates such as a semiconductor wafer, a liquid crystal display device substrate, and an organic electroluminescence (EL) display device, and substrates such as an optical disc substrate, a magnetic disk substrate, a magneto-optical disc substrate, a photomask substrate, a ceramic substrate, and a solar cell substrate.

2. Description of the Related Art

In a process of producing a semiconductor device or the like, a process of forming multiple metal wirings on a surface of a semiconductor wafer is called a backend process (BEOL: back end of the line) or the like. In the BEOL, a fine metal wiring, a plug, a via and the like are formed (for example, refer to the specification of US Patent Application Publication No. 2016/293447).

In the BEOL, etching of a metal layer with an accuracy of nanometers or less may be required. For example, in a process called a fully self-aligned via (FSAV), after a metal layer is embedded in a trench formed in an insulating film, a surface part of the metal layer is wet-etched and removed by a thickness of several tens of nanometers, and the surface of the metal layer may be retreated in the trench and a via may be formed. When the retreated via is formed, it is possible to minimize the distance between the via and the nearby wiring. In this case, a method in which wet etching can be performed precisely on the order of a one-atom layer to a several-atom layer is necessary.

However, when a desired etching amount is obtained by repeatedly performing wet etching on the order of a one-atom layer to a several-atom layer, there is a risk of a longer time being required for wet etching.

SUMMARY

Therefore, the disclosure is provides a substrate processing method and a substrate processing device in which, in a configuration for processing a substrate having a metal layer on its surface, it is possible to shorten a time required for repeating a metal oxide layer forming process and a metal oxide layer removal process and it is possible to etch the metal layer with high accuracy.

The disclosure provides a substrate processing method in which a substrate having a metal layer on its surface is processed. The substrate processing method includes a metal oxide layer forming process in which an oxidation fluid is supplied to a surface of the substrate and a metal oxide layer composed of a one-atom layer or a several-atom layer is formed on a surface layer of the metal layer; and a metal oxide layer removal process in which an etching solution is supplied to the surface of the substrate and the metal oxide layer is removed from the surface of the substrate. In the substrate processing method, the metal oxide layer forming process and the metal oxide layer removal process are alternately performed a plurality of times. In the substrate processing method, a final dissolved oxygen concentration which is a dissolved oxygen concentration in the etching solution supplied to the surface of the substrate in a final metal oxide layer removal process that is finally performed among the metal oxide layer removal processes performed a plurality of times is lower than an initial dissolved oxygen concentration which is a dissolved oxygen concentration in the etching solution supplied to the substrate in an initial metal oxide layer removal process that is performed before the final metal oxide layer removal process.

The disclosure provides a substrate processing device including an oxidation fluid nozzle from which an oxidation fluid is discharged toward a surface of a substrate having a metal layer on its surface; an etching solution tank in which an etching solution is stored; an etching solution nozzle from which an etching solution is discharged toward a surface of the substrate; a dissolved oxygen concentration reducing unit that reduces a dissolved oxygen concentration in an etching solution that is supplied from the etching solution tank to the etching solution nozzle; and a controller that controls the oxidation fluid nozzle, the etching solution nozzle, and the dissolved oxygen concentration reducing unit.

The controller is programmed to alternately perform a metal oxide layer forming process in which a metal oxide layer composed of a one-atom layer or a several-atom layer is formed on a surface layer of the metal layer by discharging an oxidation fluid from the oxidation fluid nozzle toward the surface of the substrate and a metal oxide layer removal process in which the metal oxide layer is removed from the surface of the substrate by discharging an etching solution from the etching solution nozzle toward the surface of the substrate a plurality of times.

In addition, the controller is programmed to perform a dissolved oxygen concentration adjusting process in which a dissolved oxygen concentration in an etching solution supplied to the etching solution nozzle is adjusted by the dissolved oxygen concentration reducing unit so that a final dissolved oxygen concentration which is a dissolved oxygen concentration in the etching solution supplied to the surface of the substrate in a final metal oxide layer removal process that is finally performed among the metal oxide layer removal processes performed a plurality of times is lower than an initial dissolved oxygen concentration which is a dissolved oxygen concentration in the etching solution supplied to the substrate in an initial metal oxide layer removal process that is performed before the final metal oxide layer removal process.

The above and other objectives, features and effects in the present disclosure will be clearly understood from the description of the following embodiments with reference to the appended drawings.

DETAILED DESCRIPTION OF THE PREFERRED EMBODIMENTS

Figure 1:
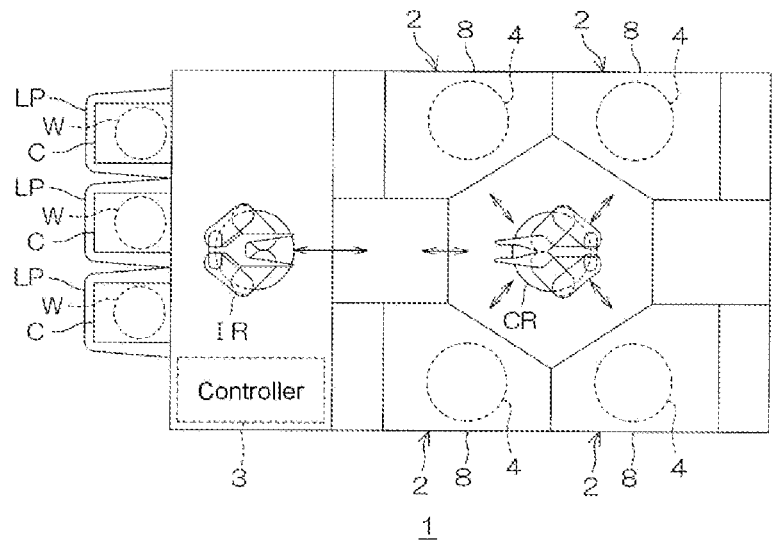
FIG. 1 is a schematic plan view for explaining an internal layout of a substrate processing device according to one embodiment of the disclosure.

FIG. 1 is a schematic plan view for explaining an internal layout of a substrate processing device 1 according to one embodiment of the disclosure. The substrate processing device 1 is a single-wafer type device that processes one substrate W such as a silicon wafer at a time.

Figure 2:
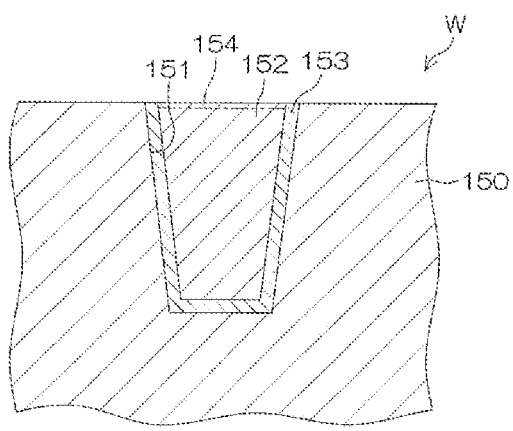
FIG. 2 is a partial cross-sectional view of the vicinity of a surface layer of a substrate which is processed in the substrate processing device.

In this embodiment, the substrate W is a disk-shaped substrate. The substrate W is a substrate having a surface on which chemical mechanical polishing (CMP) or the like is performed. FIG. 2 is a partial cross-sectional view of the vicinity of a surface layer of the substrate W. As shown in FIG. 2, the substrate W is a substrate having a metal layer on its surface. Specifically, the substrate W includes, in the vicinity of the surface layer, an insulating layer 150 in which a trench 151 is formed, a cobalt wiring 152 (metal layer) disposed in the trench 151, and a barrier layer 153 that is formed to follow the trench 151 between the cobalt wiring 152 and the insulating layer 150.

Unlike this embodiment, the substrate W may include a flat cobalt film (metal layer) disposed outside the trench 151. In addition, the substrate W may include a metal layer made of a metal other than cobalt (for example, aluminum, tungsten, copper, ruthenium, molybdenum, or the like). The barrier layer 153 is made of, for example, titanium nitride (TiN).

As shown in FIG. 1, the substrate processing device 1 includes a plurality of processing units 2 that process the substrate W with a processing solution, a load port LP in which a carrier C in which a plurality of substrates W that are processed in the processing units 2 are accommodated is loaded, transfer robots IR and CR that transfer the substrate W between the load port LP and the processing unit 2, and a controller 3 that controls the substrate processing device 1.

The transfer robot IR transfers the substrate W between the carrier C and the transfer robot CR. The transfer robot CR transfers the substrate W between the transfer robot IR and the processing unit 2. The plurality of processing units 2 have, for example, the same configuration. The processing solution includes an oxidation fluid, an etching solution, a rinse solution, an organic agent, a coating agent and the like to be described below.

The processing unit 2 includes a chamber 8 and a cup 4 disposed in the chamber 8. The substrate W is processed in the cup 4. In the chamber 8, an opening (not shown) through which the substrate W is loaded into the chamber 8 or the substrate W is unloaded from the chamber 8 is formed. The chamber 8 includes a shutter unit (not shown) that opens and closes the opening.

Figure 3:
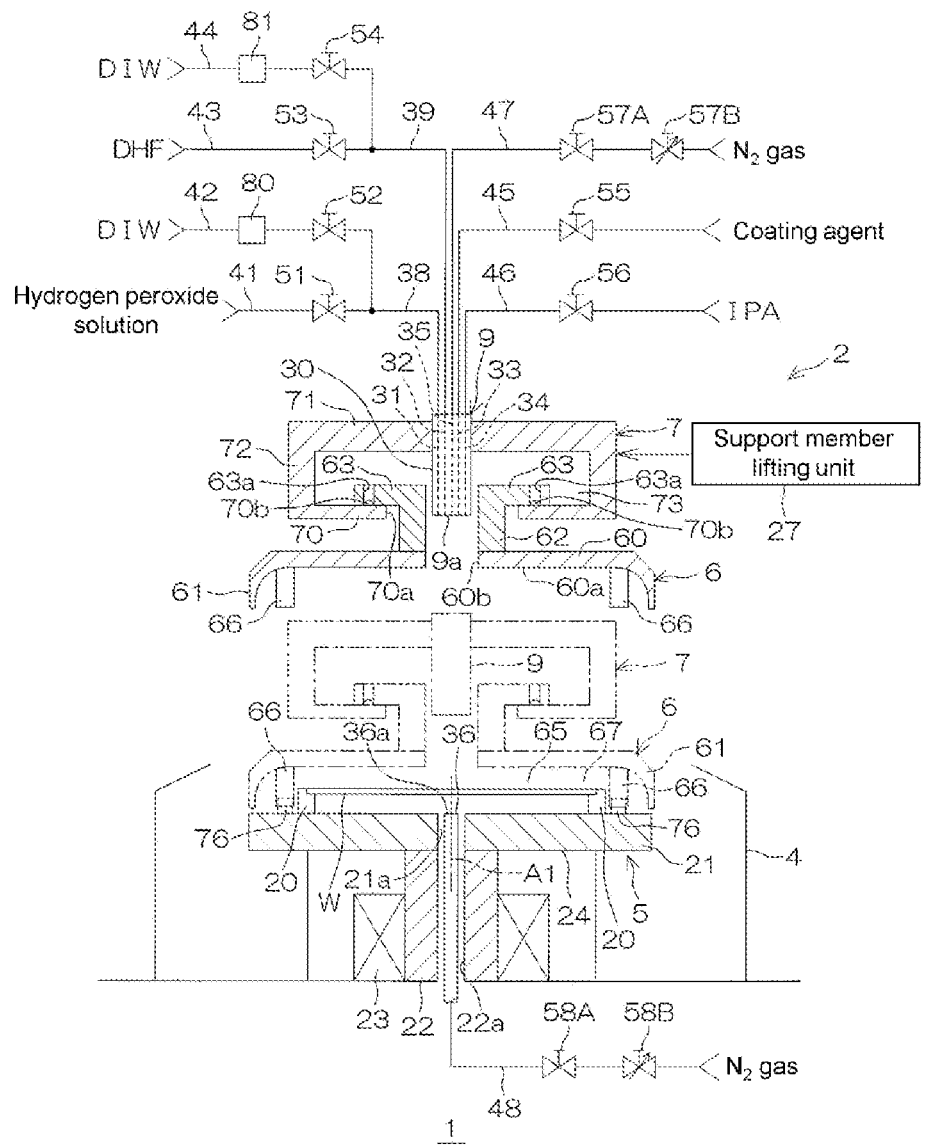
FIG. 3 is a schematic diagram of a processing unit provided in the substrate processing device.

FIG. 3 is a schematic diagram for explaining a configuration example of the processing unit 2. The processing unit 2 includes a spin chuck 5 that rotates the substrate W around a vertical rotation axis A1 that passes through the central part of the substrate W while holding the substrate W horizontally, a counter member 6 that faces the upper surface (surface) of the substrate W held by the spin chuck 5, and a support member 7 that suspends and supports the counter member 6.

The spin chuck 5 includes a substrate holding unit 24, a rotation shaft 22, and a spin motor 23.

The substrate holding unit 24 holds the substrate W horizontally. The substrate holding unit 24 includes a spin base 21 and a plurality of chuck pins 20. The spin base 21 has a disk shape in a horizontal direction. On the upper surface of the spin base 21, the plurality of chuck pins 20 are disposed at intervals in the circumferential direction.

The rotation shaft 22 extends in the vertical direction along the rotation axis A1. The upper end of the rotation shaft 22 is connected to the center of the lower surface of the spin base 21. In a central area of the spin base 21 in a plan view, a through-hole 21a that penetrates through the spin base 21 vertically is formed. The through-hole 21a communicates with an interior space 22a of the rotation shaft 22.

The spin motor 23 applies a rotational force to the rotation shaft 22. When the rotation shaft 22 is rotated by the spin motor 23, the spin base 21 rotates. Thereby, the substrate W is rotated around the rotation axis A1. Hereinafter, a radially inward direction centered on the rotation axis A1 will be simply referred to as "radially inward" and a radially outward direction centered on the rotation axis A1 will be simply referred to as "radially outward." The spin motor 23 is an example of a substrate rotation unit that rotates the substrate W around the rotation axis A1.

The counter member 6 includes a facing part 60 formed in a disk shape, an annular part 61 that extends downward from a peripheral part of the facing part 60, a tubular part 62 that extends upward from the upper surface of the facing part 60, and a plurality of flange parts 63 that extend horizontally from the upper end of the tubular part 62.

The facing part 60 faces the upper surface of the substrate W from above. The facing part 60 is disposed substantially horizontally above the spin chuck 5. The facing part 60 has a facing surface 60a that faces the upper surface of the substrate W. In a central part of the facing part 60, a through-hole 60b that penetrates through the facing part 60 vertically is formed.

The annular part 61 surrounds the substrate W in a plan view. The inner circumferential surface of the annular part 61 is curved downward and radially outward in a concave shape. The outer circumferential surface of the annular part 61 extends in the vertical direction.

The interior space of the tubular part 62 communicates with the through-hole 60b of the facing part 60. The plurality of flange parts 63 are disposed at the upper end of the tubular part 62 at intervals in the circumferential direction of the tubular part 62.

As will be described below in detail, the counter member 6 can move up and down with respect to the substrate holding unit 24. The counter member 6 can be engaged with the substrate holding unit 24 with, for example, a magnetic force. Specifically, a plurality of first engagement parts 66 provided on the counter member 6 and a plurality of second engagement parts 76 provided on the substrate holding unit 24 are attracted to and engaged with each other with a magnetic force in a concave and convex shape.

The plurality of first engagement parts 66 extend downward from the facing part 60 radially inward from the annular part 61. The plurality of first engagement parts 66 are disposed at intervals in the circumferential direction around the rotation axis A1. The plurality of second engagement parts 76 are disposed on the upper surface of the spin base 21 radially outward from the plurality of chuck pins 20 at intervals in the circumferential direction around the rotation axis A1.

When each first engagement part 66 of the counter member 6 is engaged with the second engagement part 76 corresponding to the substrate holding unit 24, the counter member 6 can rotate integrally with the spin base 21. The spin motor 23 also functions as a counter member rotating unit that rotates the counter member 6 around the rotation axis A1. When the counter member 6 is engaged with the substrate holding unit 24, the annular part 61 surrounds the substrate W from the outside in a radial (lateral) direction (refer to the two dots-dashed line in FIG. 3).

The processing unit 2 further includes a center nozzle 9 that faces the center of the substrate W from above. A discharge port 9a provided at the tip of the center nozzle 9 is accommodated in the interior space of the tubular part 62 of the counter member 6.

The center nozzle 9 includes a plurality of tubes from which a fluid is discharged downward (a first tube 31, a second tube 32, a third tube 33, a fourth tube 34, and a fifth tube 35), and a tubular casing 30 that surrounds the plurality of tubes. The plurality of tubes and the casing 30 extend in a vertical direction along the rotation axis A1. The discharge port 9a of the center nozzle 9 is also a discharge port of the first tube 31, a discharge port of the second tube 32, a discharge port of the third tube 33, a discharge port of the fourth tube 34, or a discharge port of the fifth tube 35.

The first tube 31 functions as an oxidation fluid supply unit that supplies an oxidation fluid such as a hydrogen peroxide ($H_2O_2$) solution to the upper surface of the substrate W and functions as a first rinse solution supply unit that supplies a first rinse solution such as deionized water (DIW) to the upper surface of the substrate W.

The oxidation fluid discharged from the first tube 31 has enough oxidation power to form a cobalt oxide layer 154 (refer to the two dots-dashed line in FIG. 2) as a metal oxide layer composed of a one-atom layer or a several-atom layer on the surface layer of the cobalt wiring 152 of the substrate W (refer to FIG. 2). The pH of the oxidation fluid discharged from the first tube 31 is preferably 7 to 11 and more preferably 9 to 10. The redox potential of the oxidation fluid discharged from the first tube 31 is preferably equal to or lower than that of hydrogen peroxide.

When the oxidation fluid discharged from the first tube 31 is a hydrogen peroxide solution, the concentration of hydrogen peroxide as an oxidant in the oxidation fluid is preferably 1 ppm to 100 ppm. When the oxidation fluid discharged from the first tube 31 is a hydrogen peroxide solution, the first tube 31 functions as a hydrogen peroxide solution supply unit. The center nozzle 9 is an example of an oxidation fluid nozzle from which an oxidation fluid is discharged.

The oxidation fluid discharged from the first tube 31 is not limited to the hydrogen peroxide solution. The oxidation fluid discharged from the first tube 31 may be a fluid containing at least one of perchloric acid ($HClO_4$), nitric acid ($HNO_3$), an ammonia hydrogen peroxide solution mixture (SC1 solution), ozone ($O_3$) dissolved water, oxygen ($O_2$) dissolved water, dry air, and ozone gas.

The first rinse solution discharged from the first tube 31 is not limited to DIW, and may be carbonated water, electrolytic ionic water, hydrochloric acid water with a diluted concentration (for example, about 1 ppm to 100 ppm), diluted ammonia water with a diluted concentration (for example, about 1 ppm to 100 ppm), or reduced water (hydrogen water).

The first tube 31 is connected to a first common pipe 38 through which both the oxidation fluid and the first rinse solution pass. The first common pipe 38 is branched into an oxidation fluid pipe 41 at which an oxidation fluid valve 51 is provided and a first rinse solution pipe 42 at which a first rinse solution valve 52 is provided.

A degassing unit 80 that degasses a first rinse solution is provided at the first rinse solution pipe 42. Degassing refers to reducing the amount of a gas such as oxygen dissolved in a liquid. The first tube 31 is an example of a first degassing rinse solution supply unit that supplies the degassed first rinse solution to the upper surface of the substrate W.

For example, the degassing unit 80 is a unit configured to degas oxygen from a liquid under a reduced pressure or the like through a hollow fiber membrane having gas permeability and liquid impermeability. Regarding a degassing unit having such a configuration, for example, "Liqui-Cel (trademark) membrane contactor" (product name, commercially available from 3M) can be used. Degassing units 81, 93B and 103B to be described below may also have the same configuration as the degassing unit 80.

When the oxidation fluid valve 51 is opened, an oxidation fluid is supplied to the first tube 31 via the oxidation fluid pipe 41 and the first common pipe 38. Then, the oxidation fluid is continuously discharged downward from the discharge port of the first tube 31 (the discharge port 9a of the center nozzle 9). When the first rinse solution valve 52 is opened, the degassed first rinse solution is supplied to the first tube 31 via the first rinse solution pipe 42 and the first common pipe 38. Then, the first rinse solution is degassed by the degassing unit 80, and continuously discharged downward from the discharge port of the first tube 31. That is, when the oxidation fluid valve 51 and the first rinse solution valve 52 are opened and closed, the fluid supplied from the first tube 31 is switched to either the oxidation fluid or the first rinse solution.

The second tube 32 has a function as an etching solution supply unit that supplies an etching solution such as dilute hydrofluoric acid (DHF) to the upper surface of the substrate W and a function as a second rinse solution supply unit that supplies a second rinse solution such as DIW to the upper surface of the substrate W. The center nozzle 9 is an example of an etching solution nozzle from which an etching solution is discharged.

The etching solution discharged from the second tube 32 is not limited to dilute hydrofluoric acid. The etching solution discharged from the second tube 32 may be an acidic chemical liquid such as an inorganic acid or an organic acid. The acidic chemical liquid may be, for example, a fluid containing at least one of dilute hydrofluoric acid, hydrochloric acid, acetic acid, citric acid, and glycolic acid.

The second rinse solution discharged from the second tube 32 is not limited to DIW, and may be carbonated water, electrolytic ionic water, hydrochloric acid water with a diluted concentration (for example, about 1 ppm to 100 ppm), diluted ammonia water with a diluted concentration (for example, about 1 ppm to 100 ppm), or reduced water (hydrogen water).

The second tube 32 is connected to a second common pipe 39 through which both the etching solution and the second rinse solution pass. The second common pipe 39 is branched into an etching solution pipe 43 at which an etching solution valve 53 is provided and a second rinse solution pipe 44 at which a second rinse solution valve 54 is provided. As will be described below in detail, the degassed etching solution is supplied to the etching solution pipe 43 from an etching solution supply device 10 (refer to FIG. 4 to be described below).

The degassing unit 81 that degasses the second rinse solution is provided at the second rinse solution pipe 44. The second tube 32 is an example of a second degassing rinse solution supply unit that supplies the degassed second rinse solution to the upper surface of the substrate W.

When the etching solution valve 53 is opened, the degassed etching solution is supplied to the second tube 32 via the etching solution pipe 43 and the second common pipe 39. The degassed etching solution is continuously discharged downward from the discharge port of the second tube 32 (the discharge port 9a of the center nozzle 9). When the second rinse solution valve 54 is opened, the second rinse solution is supplied to the second tube 32 via the second rinse solution pipe 44 and the second common pipe 39. The second rinse solution is degassed by the degassing unit 81 and continuously discharged downward from the discharge port of the second tube 32. That is, when the etching solution valve 53 and the second rinse solution valve 54 are opened and closed, the fluid supplied from the second tube 32 is switched to either the etching solution or the second rinse solution.

The third tube 33 has a function as a coating agent supply unit that supplies a coating agent to the upper surface of the substrate W. The coating agent is a liquid that forms a coating film which covers and protects the upper surface of the substrate W. When an organic solvent constituting the coating agent is evaporated, a coating film covering the surface of the substrate W is formed.

The coating film may simply cover the surface of the substrate W or may cover the surface of the substrate W while it is chemically reacted with the surface of the insulating layer 150 or the surface of the cobalt wiring 152 and integrated therewith. When the coating film is formed, oxidation of the cobalt wiring 152 of the substrate W is reduced.

The third tube 33 is connected to a coating agent pipe 45 at which a coating agent valve 55 is provided. When the coating agent valve 55 is opened, the coating agent is supplied to the third tube 33 from the coating agent pipe 45 and continuously discharged downward from the discharge port of the third tube 33 (the discharge port 9a of the center nozzle 9).

The coating agent discharged from the third tube 33 is, for example, a solution in which a sublimable acrylic polymer is dissolved in an organic solvent. Examples of an organic solvent in which a sublimable acrylic polymer is dissolved include PGEE (1-ethoxy-2-propanol).

The coating agent discharged from the third tube 33 may be a surface water repellent agent. Examples of a surface water repellent agent include a solution in which an organic silane such as hexamethyldisilazane is dissolved in an organic solvent and a solution in which an alkanethiol such as decanethiol is dissolved in an organic agent.

Examples of an organic solvent in which an organic silane is dissolved include PGMEA (2-acetoxy-1-methoxypropane). Examples of an organic solvent in which an alkanethiol is dissolved include heptane.

When an organic thiol is used, a thiol organic molecular layer is formed as a coating film on the surface of the cobalt wiring 152, and thus oxidation of the surface of the cobalt wiring 152 is prevented.

The fourth tube 34 has a function as an organic agent supply unit that supplies an organic agent such as isopropyl alcohol (IPA) to the upper surface of the substrate W. The fourth tube 34 is connected to an organic agent pipe 46 at which an organic agent valve 56 is provided. When the organic agent valve 56 is opened, the organic agent is supplied from the organic agent pipe 46 to the fourth tube 34 and continuously discharged downward from the discharge port of the fourth tube 34 (the discharge port 9a of the center nozzle 9).

The organic agent discharged from the fourth tube 34 may be an organic agent other than IPA as long as it can be mixed with both the second rinse solution and the coating agent. More specifically, the organic agent discharged from the fourth tube 34 may be a solution containing at least one of IPA, hydrofluoroether (HFE), methanol, ethanol, acetone, and trans-1,2-dichloroethylene.

From the fifth tube 35, an inert gas such as nitrogen gas ($N_2$ gas) is discharged. The fifth tube 35 is connected to an upper inert gas pipe 47 at which an upper inert gas valve 57A and an upper inert gas flow rate adjusting valve 57B are provided.

When the upper inert gas valve 57A is opened, the inert gas is supplied from the upper inert gas pipe 47 to the fifth tube 35 and continuously discharged downward from the discharge port of the fifth tube 35 (the discharge port 9a of the center nozzle 9). The inert gas discharged from the fifth tube 35 passes through the interior space of the tubular part 62 of the counter member 6 and the through-hole 60b of the facing part 60, and is supplied to a space 65 between the facing surface 60a of the facing part 60 and the upper surface of the substrate W. When the degree of opening of the upper inert gas flow rate adjusting valve 57B is adjusted, a flow rate of the inert gas discharged from the fifth tube 35 is adjusted.

The inert gas discharged from the fifth tube 35 is a gas inert to the upper surface and the pattern of the substrate W. The inert gas discharged from the fifth tube 35 is not limited to nitrogen gas, and may be, for example, a noble gas such as argon gas.

The processing unit 2 includes a bottom nozzle 36 from which an inert gas such as nitrogen gas is discharged toward the central part of the lower surface of the substrate W. The bottom nozzle 36 is inserted into the through-hole 21a of the spin base 21 and the interior space 22a of the rotation shaft 22. A discharge port 36a of the bottom nozzle 36 is exposed from the upper surface of the spin base 21. The discharge port 36a of the bottom nozzle 36 faces the central part of the lower surface of the substrate W from below. The bottom nozzle 36 is connected to a lower inert gas pipe 48 at which a lower inert gas valve 58A and a lower inert gas flow rate adjusting valve 58B are provided.

When the lower inert gas valve 58A is opened, the inert gas is supplied from the lower inert gas pipe 48 to the bottom nozzle 36 and continuously discharged upward from the discharge port 36a of the bottom nozzle 36. When the degree of opening of the lower inert gas flow rate adjusting valve 58B is adjusted, a flow rate of the inert gas discharged from the bottom nozzle 36 is adjusted. Even if the spin chuck 5 rotates the substrate W, the bottom nozzle 36 does not rotate.

The inert gas discharged from the bottom nozzle 36 is a gas inert to the upper surface and the pattern of the substrate W. The inert gas discharged from the bottom nozzle 36 is not limited to nitrogen gas, and may be, for example, a noble gas such as argon gas.

The support member 7 includes a counter member support part 70 that supports the counter member 6, a nozzle support part 71 that is provided above the counter member support part 70 and supports the casing 30 of the center nozzle 9, and a wall part 72 that connects the counter member support part 70 and the nozzle support part 71 and extends in the vertical direction.

A space 73 is defined by the counter member support part 70, the nozzle support part 71, and the wall part 72. The counter member support part 70 forms a lower wall of the support member 7. The nozzle support part 71 forms an upper wall of the support member 7. In the space 73, the upper end of the tubular part 62 of the counter member 6 and the flange part 63 are accommodated. The casing 30 and the nozzle support part 71 are in close contact with each other.

The counter member support part 70 supports (the flange part 63 of) the counter member 6 from below. In a central part of the counter member support part 70, a tubular part insertion hole 70a into which the tubular part 62 is inserted is formed. In each of the flange parts 63, a positioning hole 63a that penetrates the flange part 63 in the vertical direction is formed. In the counter member support part 70, an engagement protrusion 70b that can be engaged with the positioning hole 63a of the corresponding flange part 63 is formed. The corresponding engagement protrusion 70b is engaged with each positioning hole 63a, and thus the counter member 6 is positioned with respect to the support member 7 in the rotation direction around the rotation axis A1.

The processing unit 2 includes a support member lifting unit 27 that moves the support member 7 up and down. The support member lifting unit 27 includes, for example, a ball screw mechanism (not shown) that moves the support member 7 up and down and an electric motor (not shown) that applies a driving force to the ball screw mechanism.

The support member lifting unit 27 allows the support member 7 to be positioned at a predetermined height position from an upper position (a position indicated by the solid line in FIG. 3) to a lower position (a position indicated in FIG. 7A to be described below). The lower position is a position at which the support member 7 is closest to the upper surface of the spin base 21 in a movable range of the support member 7. The upper position is a position at which the support member 7 is farthest from the upper surface of the spin base 21 in a movable range of the support member 7.

When the support member 7 is positioned at the upper position, it suspends and supports the counter member 6. When the support member 7 is moved up and down by the support member lifting unit 27, it passes through an engagement position between the upper position and the lower position (the position indicated by the two dots-dashed line in FIG. 3).

The support member 7 is lowered together with the counter member 6 from the upper position to the engagement position. When the support member 7 reaches the engagement position, it transfers the counter member 6 to the substrate holding unit 24. When the support member 7 reaches a position below the engagement position, it separates from the counter member 6. When the support member 7 rises from the lower position and reaches the engagement position, it receives the counter member 6 from the substrate holding unit 24. The support member 7 rises together with the counter member 6 from the engagement position to the upper position.

In this manner, when the support member 7 is moved up and down by the support member lifting unit 27, the counter member 6 moves up and down with respect to the substrate holding unit 24. Therefore, the support member lifting unit 27 functions as a counter member lifting unit.

Figure 4:
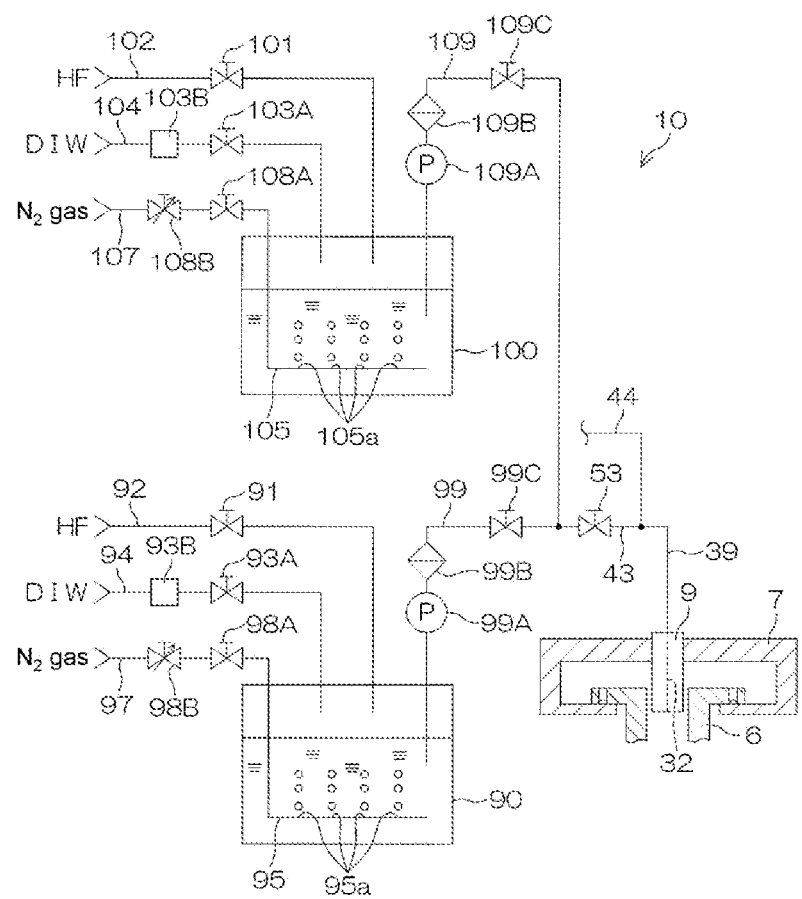
FIG. 4 is a schematic diagram of an etching solution supply device provided in the substrate processing device.

FIG. 4 is a schematic diagram of the etching solution supply device 10 provided in the substrate processing device 1. The etching solution supply device 10 supplies an etching solution to the etching solution pipe 43. The etching solution supply device 10 includes a first etching solution tank 90 in which an etching solution is stored and a second etching solution tank 100 in which an etching solution having a lower dissolved oxygen concentration than that of the first etching solution tank 90 is stored.

The etching solution supply device 10 includes a first stock solution supply pipe 92 through which a stock solution (for example, hydrofluoric acid (HF)) of an etching solution is supplied from a stock solution supply source to the first etching solution tank 90, a first DIW supply pipe 94 through which DIW is supplied to the first etching solution tank 90 in order to adjust the concentration of the etching solution in the first etching solution tank 90, a first bubbling nozzle 95 from which an inert gas such as nitrogen gas is sent to the etching solution in the first etching solution tank 90, and a first etching solution sending pipe 99 through which an etching solution in the first etching solution tank 90 is supplied to the etching solution pipe 43.

A first stock solution valve 91 that opens and closes a flow channel in the first stock solution supply pipe 92 is provided at the first stock solution supply pipe 92. A first DIW valve 93A that opens and closes a flow channel in the first DIW supply pipe 94 and the degassing unit 93B that degasses DIW which flows in the first DIW supply pipe 94 are provided at the first DIW supply pipe 94.

When the concentration of the etching solution in the first etching solution tank 90 increases according to the stock solution supplied from the first stock solution supply pipe 92, and the concentration of the etching solution in the first etching solution tank 90 is reduced according to DIW supplied from the first DIW supply pipe 94, the etching solution in the first etching solution tank 90 can be adjusted to have a desired concentration.

The first bubbling nozzle 95 extends horizontally below the liquid surface of the etching solution in the first etching solution tank 90. The first bubbling nozzle 95 has a plurality of discharge ports 95a arranged in a direction in which the first bubbling nozzle 95 extends (substantially in the horizontal direction). The first bubbling nozzle 95 is an example of a first bubbling unit that adjusts a dissolved oxygen concentration in the etching solution that sends an inert gas to the etching solution in the first etching solution tank 90.

The etching solution supply device 10 further includes a first inert gas supply pipe 97 through which an inert gas is supplied to the first bubbling nozzle 95, a first inert gas supplying valve 98A provided at the first inert gas supply pipe 97, and a first bubbling flow rate adjusting valve 98B provided at the first inert gas supply pipe 97.

When the first inert gas supplying valve 98A is opened, the inert gas is supplied from an inert gas supply source to the first bubbling nozzle 95 via the first inert gas supply pipe 97. The inert gas is discharged from the plurality of discharge ports 95a of the first bubbling nozzle 95 and sent to the etching solution in the first etching solution tank 90. The dissolved oxygen concentration in the etching solution in the first etching solution tank 90 is reduced due to the inert gas sent to the etching solution in the first etching solution tank 90.

When the degree of opening of the first bubbling flow rate adjusting valve 98B is adjusted, a flow rate of the inert gas sent to the etching solution in the first etching solution tank 90 from the first bubbling nozzle 95 is adjusted. Therefore, when the degree of opening of the first bubbling flow rate adjusting valve 98B is adjusted, the dissolved oxygen concentration in the etching solution in the first etching solution tank 90 can be adjusted. In other words, the dissolved oxygen concentration in the etching solution supplied from the first etching solution tank 90 to the second tube 32 is adjusted (dissolved oxygen concentration adjusting process). The first bubbling flow rate adjusting valve 98B is an example of the bubbling flow rate adjusting unit.

One end of the first etching solution sending pipe 99 is positioned below the liquid surface of the etching solution in the first etching solution tank 90. The other end of the first etching solution sending pipe 99 is connected to an end opposite to the second tube 32 in the etching solution pipe 43.

At the first etching solution sending pipe 99, a first pump 99A that generates a driving force for sending an etching solution to the second tube 32 via the etching solution pipe 43, a first filter 99B for removing impurities in the etching solution, and a first liquid sending valve 99C that opens and closes a flow channel in the first etching solution sending pipe 99 are provided.

When the first liquid sending valve 99C is opened, the etching solution with an adjusted dissolved oxygen concentration is sent to the second tube 32 via the etching solution pipe 43 by the first pump 99A. The etching solution is filtered by passing through the first filter 99B on the way toward the etching solution pipe 43.

The etching solution supply device 10 includes a second stock solution supply pipe 102 through which a stock solution (for example, hydrofluoric acid (HF)) of an etching solution is supplied from a stock solution supply source to the second etching solution tank 100, a second DIW supply pipe 104 through which DIW is supplied to the second etching solution tank 100 in order to adjust the concentration of the etching solution in the second etching solution tank 100, a second bubbling nozzle 105 from which an inert gas such as nitrogen gas is sent to the etching solution in the second etching solution tank 100, and a second etching solution sending pipe 109 through which the etching solution in the second etching solution tank 100 is supplied to the etching solution pipe 43.

A second stock solution valve 101 that opens and closes a flow channel in the second stock solution supply pipe 102 is provided at the second stock solution supply pipe 102. A second DIW valve 103A that opens and closes a flow channel in the second DIW supply pipe 104 and the degassing unit 103B that degasses DIW which flows in the second DIW supply pipe 104 are provided at the second DIW supply pipe 104.

When the concentration of the etching solution in the second etching solution tank 100 increases according to the stock solution supplied from the second stock solution supply pipe 102, and the concentration of the etching solution in the second etching solution tank 100 is reduced according to DIW supplied from the second DIW supply pipe 104, the etching solution in the second etching solution tank 100 can be adjusted to have a desired concentration.

The second bubbling nozzle 105 extends horizontally below the liquid surface of the etching solution in the second etching solution tank 100. The second bubbling nozzle 105 has a plurality of discharge ports 105a arranged in a direction in which the second bubbling nozzle 105 extends (substantially in the horizontal direction). The second bubbling nozzle 105 is an example of a second bubbling unit that adjusts a dissolved oxygen concentration in the etching solution that sends an inert gas to the etching solution in the second etching solution tank 100.

The etching solution supply device 10 further includes a second inert gas supply pipe 107 through which an inert gas is supplied to the second bubbling nozzle 105, a second inert gas supplying valve 108A provided at the second inert gas supply pipe 107, and a second bubbling flow rate adjusting valve 108B provided at the second inert gas supply pipe 107.

When the second inert gas supplying valve 108A is opened, an inert gas is supplied from the inert gas supply source to the second bubbling nozzle 105 via the second inert gas supply pipe 107. The inert gas is discharged from the plurality of discharge ports 105a of the second bubbling nozzle 105 and is sent to the etching solution in the second etching solution tank 100. The dissolved oxygen concentration in the etching solution in the second etching solution tank 100 is reduced due to the inert gas sent to the etching solution in the second etching solution tank 100.

When the degree of opening of the second bubbling flow rate adjusting valve 108B is adjusted, a flow rate of the inert gas sent to the etching solution in the second etching solution tank 100 from the second bubbling nozzle 105 is adjusted. Therefore, when the degree of opening of the second bubbling flow rate adjusting valve 108B is adjusted, the dissolved oxygen concentration in the etching solution in the second etching solution tank 100 can be adjusted. In other words, the dissolved oxygen concentration in the etching solution supplied from the second etching solution tank 100 to the second tube 32 is adjusted (dissolved oxygen concentration adjusting process).

The first bubbling flow rate adjusting valve 98B and the second bubbling flow rate adjusting valve 108B are adjusted so that a flow rate of an inert gas sent from the second bubbling nozzle 105 to the second etching solution tank 100 (second inert gas flow rate) is higher than a flow rate of an inert gas sent from the first bubbling nozzle 95 to the first etching solution tank 90 (first inert gas flow rate).

Thereby, a dissolved oxygen concentration (second dissolved oxygen concentration) in the etching solution in the second etching solution tank 100 is lower than a dissolved oxygen concentration (first dissolved oxygen concentration) in the etching solution in the first etching solution tank 90.

The first dissolved oxygen concentration is a concentration within a first reference concentration range. The first reference concentration range is, for example, a range of higher than 200 ppb and 500 ppb or less. The second dissolved oxygen concentration is a concentration within a second reference concentration range. The second reference concentration range is, for example, a range of 0 ppb or more to 200 ppb or less. The second reference concentration range is preferably a range of 0 ppb or more to 30 ppb or less.

One end of the second etching solution sending pipe 109 is positioned below the liquid surface of the etching solution in the second etching solution tank 100. The other end of the second etching solution sending pipe 109 is connected to an end opposite to the second tube 32 in the etching solution pipe 43 together with the other end of the first etching solution sending pipe 99.

At the second etching solution sending pipe 109, a second pump 109A that generates a driving force for sending an etching solution to the second tube 32 via the etching solution pipe 43, a second filter 109B for removing impurities in the etching solution, and a second liquid sending valve 109C that opens and closes a flow channel in the second etching solution sending pipe 109 are provided.

When the second liquid sending valve 109C is opened, the etching solution with an adjusted dissolved oxygen concentration is sent to the second tube 32 via the etching solution pipe 43 by the second pump 109A. The etching solution is filtered by passing through the second filter 109B on the way toward the etching solution pipe 43.

Figure 5:
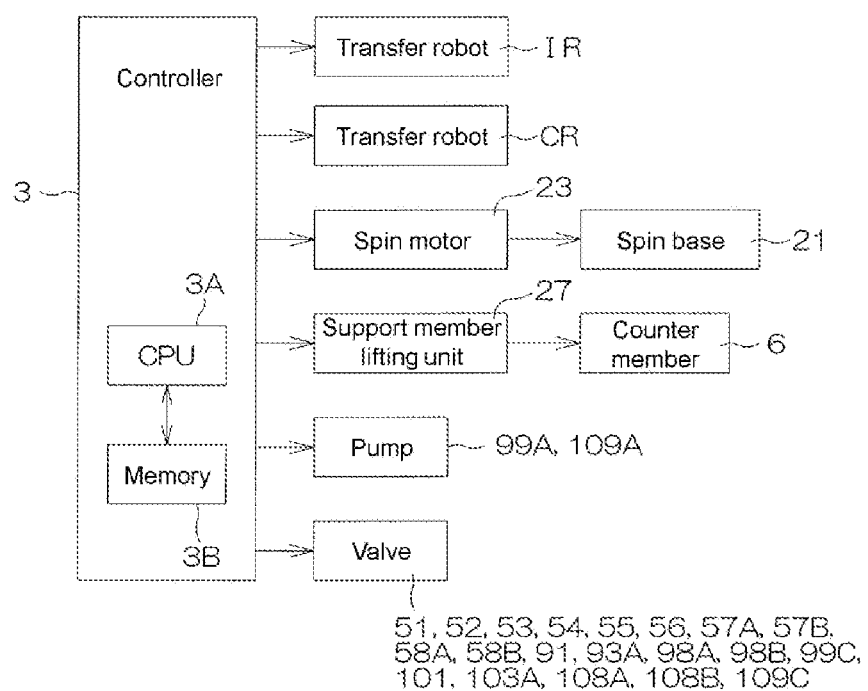
FIG. 5 is a block diagram showing an electrical configuration of main parts of the substrate processing device.

FIG. 5 is a block diagram showing an electrical configuration of main parts of the substrate processing device 1. The controller 3 includes a microcomputer, and controls a control subject provided in the substrate processing device 1 according to a predetermined program. More specifically, the controller 3 includes a processor (CPU) 3A and a memory 3B in which a program is stored, and is configured to perform various controls for substrate processing when the processor 3A executes a program.

In particular, the controller 3 controls operations of the transfer robots IR and CR, the spin motor 23, the support member lifting unit 27, the first pump 99A, the second pump 109A, the oxidation fluid valve 51, the first rinse solution valve 52, the etching solution valve 53, the second rinse solution valve 54, the coating agent valve 55, the organic agent valve 56, the upper inert gas valve 57A, the upper inert gas flow rate adjusting valve 57B, the lower inert gas valve 58A, the lower inert gas flow rate adjusting valve 58B, the first stock solution valve 91, the first DIW valve 93A, the first inert gas supplying valve 98A, the first bubbling flow rate adjusting valve 98B, the first liquid sending valve 99C, the second stock solution valve 101, the second DIW valve 103A, the second inert gas supplying valve 108A, the second bubbling flow rate adjusting valve 108B, the second liquid sending valve 109C, and the like. When the valve is controlled, control concerning whether or not to discharge a fluid from the corresponding nozzle or tube and control of a flow rate are performed.

Figure 6:
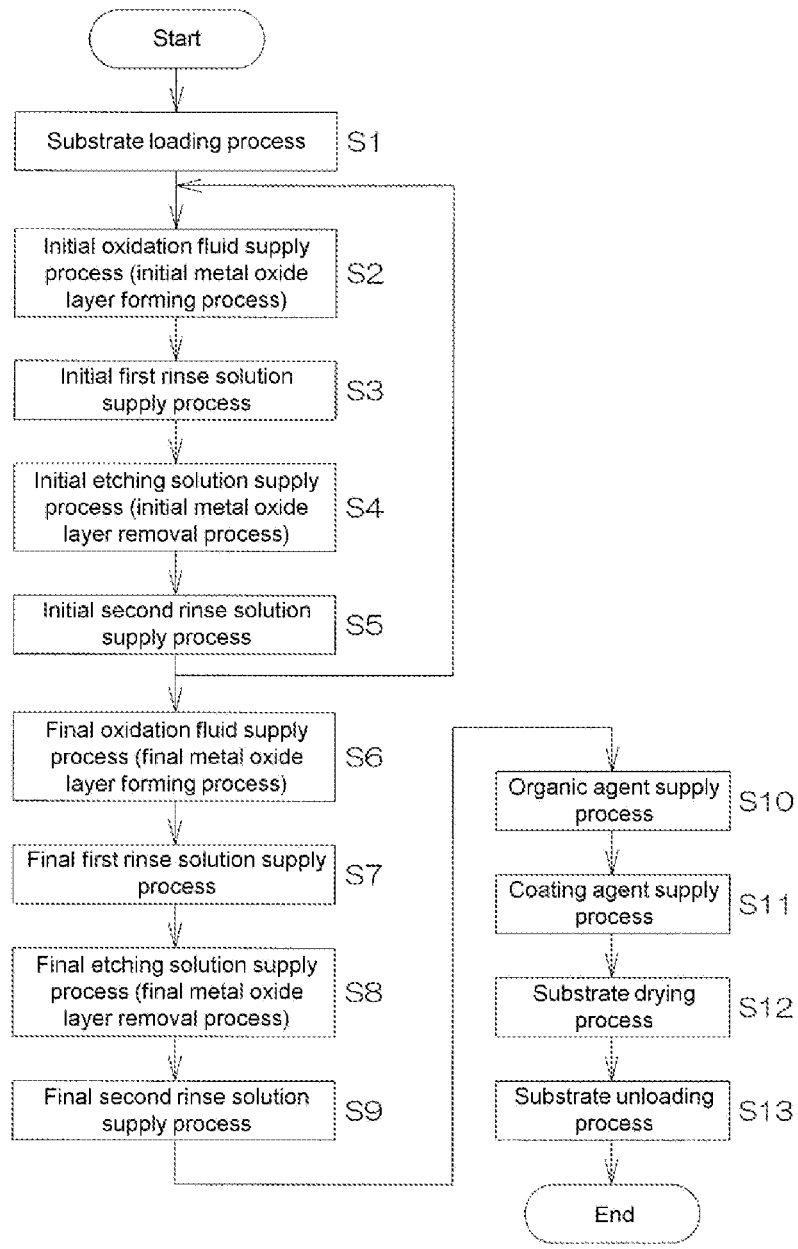
FIG. 6 is a flowchart for explaining an example of a substrate process performed by the substrate processing device.

FIG. 6 is a flowchart for explaining an example of a substrate process performed by the substrate processing device 1 and mainly shows a process performed when the controller 3 executes a program. FIG. 7A to FIG. 7F are schematic cross-sectional views for explaining an example of the substrate process.

In the substrate process performed by the substrate processing device 1, for example, as shown in FIG. 6, first, a substrate loading process (Step S1) is performed. Then, an oxidation fluid supply process, a first rinse solution supply process, an etching solution supply process, and a second rinse solution supply process are performed a plurality of times (at least twice) in this order (Step S2 to Step S9).

Among the oxidation fluid supply processes performed a plurality of times, the oxidation fluid supply process that is performed finally is referred to as a final oxidation fluid supply process (Step S6), and the oxidation fluid supply process that is performed before that is referred to as an initial oxidation fluid supply process (Step S2). Similarly, among the first rinse solution supply processes performed a plurality of times, the first rinse solution supply process that is performed finally is referred to as a final first rinse solution supply process (Step S7), and the first rinse solution supply process that is performed before that is referred to as an initial first rinse solution supply process (Step S3).

Similarly, among the etching solution supply processes performed a plurality of times, the etching solution supply process that is performed finally is referred to as a final etching solution supply process (Step S8), and the etching solution supply process that is performed before that is referred to as an initial etching solution supply process (Step S4). Similarly, among the second rinse solution supply processes performed a plurality of times, the second rinse solution supply process that is performed finally is referred to as a final second rinse solution supply process (Step S9), and the second rinse solution supply process that is performed before that is referred to as an initial second rinse solution supply process (Step S5).

After the final second rinse solution supply process (Step S9), an organic agent supply process (Step S10), a coating agent supply process (Step S11), a substrate drying process (Step S12), and a substrate unloading process (Step S13) are performed in this order.

The substrate process performed by the substrate processing device 1 will be described below in detail.

First, before the substrate W is loaded into the processing unit 2, a relative position between the counter member 6 and the substrate holding unit 24 in the rotation direction is adjusted so that the counter member 6 and the substrate holding unit 24 can be engaged with each other while the support member 7 is positioned at the upper position. Specifically, in a plan view, the spin motor 23 adjusts the position of the substrate holding unit 24 in the rotation direction so that the first engagement part 66 of the counter member 6 and the second engagement part 76 of the substrate holding unit 24 overlap.

Then, as shown in FIG. 1, in the substrate process performed by the substrate processing device 1, the substrate W is loaded into the processing unit 2 from the carrier C by the transfer robots IR and CR, and transferred to the spin chuck 5 (Step S1: substrate loading process). Then, the substrate W is horizontally held by the chuck pins 20 at intervals above the upper surface of the spin base 21 until it is unloaded by the transfer robot CR (substrate holding process).

Figure 7A:
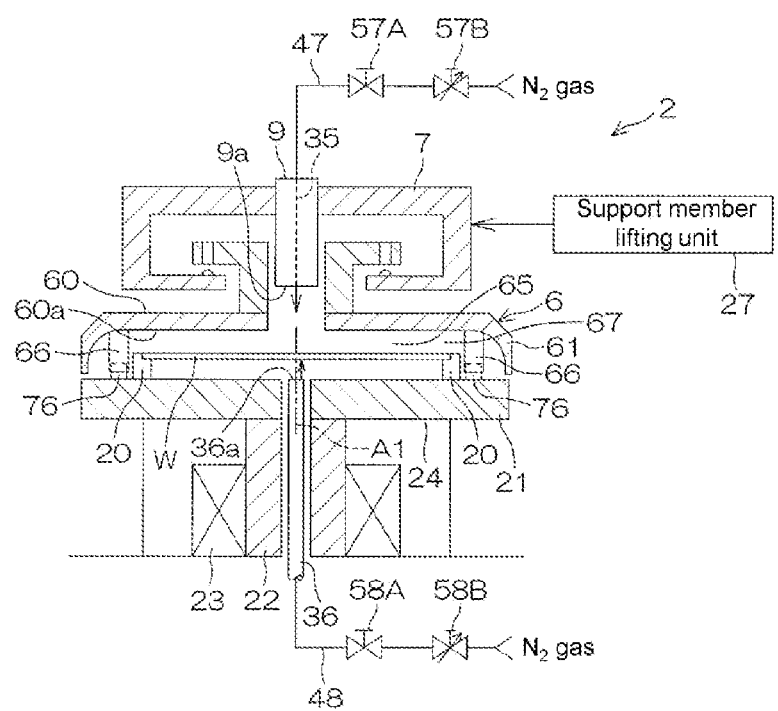
FIG. 7A to FIG. 7F are schematic cross-sectional views for explaining the substrate process.

Then, as shown in FIG. 7A, the support member lifting unit 27 lowers the support member 7 positioned at the upper position to the lower position. The support member 7 passes through the engagement position before it moves to the lower position. When the support member 7 passes through the engagement position, the counter member 6 and the substrate holding unit 24 are engaged with a magnetic force. Thereby, the support member lifting unit 27 positions the counter member 6 at a position at which the annular part 61 surrounds the substrate W from radially outward (lateral) (counter member disposing process). Thereby, the substrate W is accommodated in an accommodation space 67 defined by the counter member 6 and the spin base 21. The space 65 between the upper surface of the substrate W and the facing surface 60a of the facing part 60 is a part of the accommodation space 67.

Then, the upper inert gas valve 57A is opened. In addition, the upper inert gas flow rate adjusting valve 57B is adjusted. Thereby, an inert gas such as nitrogen gas ($N_2$ gas) is supplied from the fifth tube 35 to the space 65 (inert gas supply process). Then, the lower inert gas valve 58A is opened. In addition, the lower inert gas flow rate adjusting valve 58B is adjusted. Thereby, an inert gas such as nitrogen gas ($N_2$ gas) is supplied from the bottom nozzle 36 to the lower surface of the substrate W.

Nitrogen gas supplied to the lower surface of the substrate W goes around the upper surface side of the substrate W. Therefore, nitrogen gas discharged from the bottom nozzle 36 is eventually supplied to the space 65 (inert gas supply process). Thereby, the entire accommodation space 67 is filled with an inert gas and eventually the space 65 is filled with an inert gas. That is, the concentration of oxygen in the space 65 is reduced.

In this manner, the fifth tube 35 and the bottom nozzle 36 function as an inert gas supply unit that supplies an inert gas to the space 65.

Figure 7B:
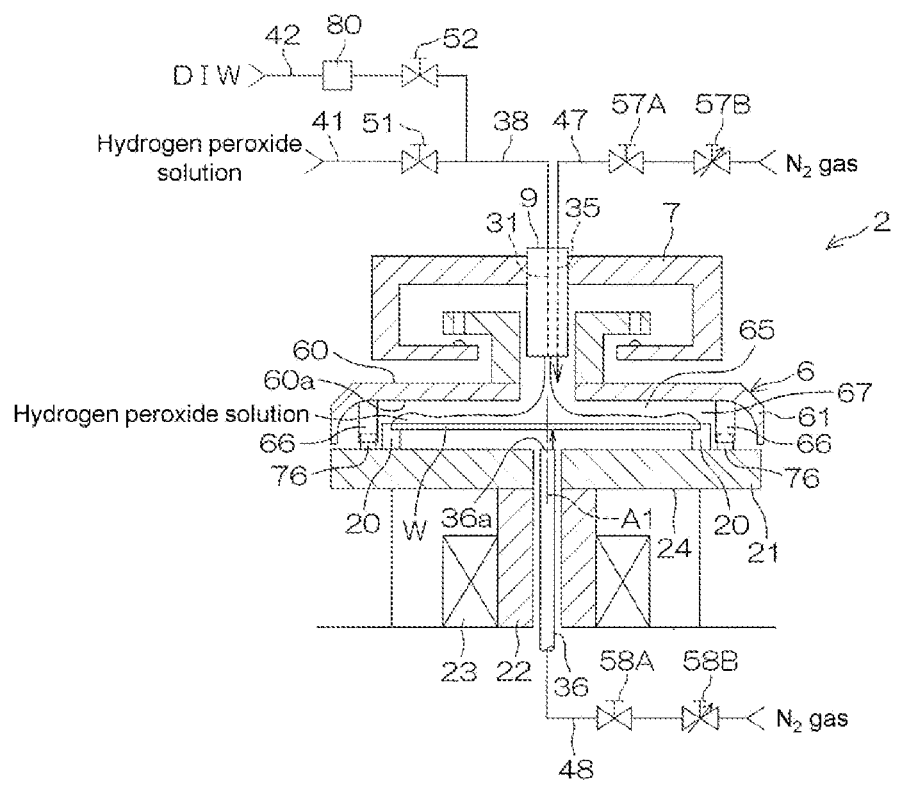

Next, the oxidation fluid valve 51 is opened. Thereby, as shown in FIG. 7B, an oxidation fluid such as a hydrogen peroxide ($H_2O_2$) solution is supplied (discharged) from the first tube 31 toward a central area of the upper surface of the substrate W (Step S2: initial oxidation fluid supply process). When the oxidation fluid is supplied to the upper surface of the substrate W, the cobalt wiring 152 of the substrate W is oxidized (refer to FIG. 2). Thereby, the cobalt oxide layer 154 (refer to FIG. 2) is formed (metal oxide layer forming process, initial metal oxide layer forming process).

The oxidation fluid spreads over the entire upper surface of the substrate W due to a centrifugal force. The oxidation fluid on the substrate W scatters radially outward from the substrate W due to a centrifugal force and received in the cup 4.

After supply of the oxidation fluid to the upper surface of the substrate W continues for a predetermined time (for example, 10 seconds), the oxidation fluid valve 51 is closed. On the other hand, the first rinse solution valve 52 is opened. Thereby, a first rinse solution such as DIW is supplied (discharged) from the first tube 31 toward a central area of the upper surface of the substrate W (Step S3: initial first rinse solution supply process). The first rinse solution discharged from the first tube 31 is degassed by the degassing unit 80 (degassing rinse solution supply process, degassing first rinse solution supply process).

The first rinse solution spreads over the entire upper surface of the substrate W due to a centrifugal force. Thereby, the oxidation fluid adhered to the upper surface of the substrate W is washed off with the first rinse solution (degassing rinse process, degassing first rinsing step). The oxidation fluid and the first rinse solution on the substrate W scatter radially outward from the substrate W due to a centrifugal force and received in the cup 4.

Figure 7C:
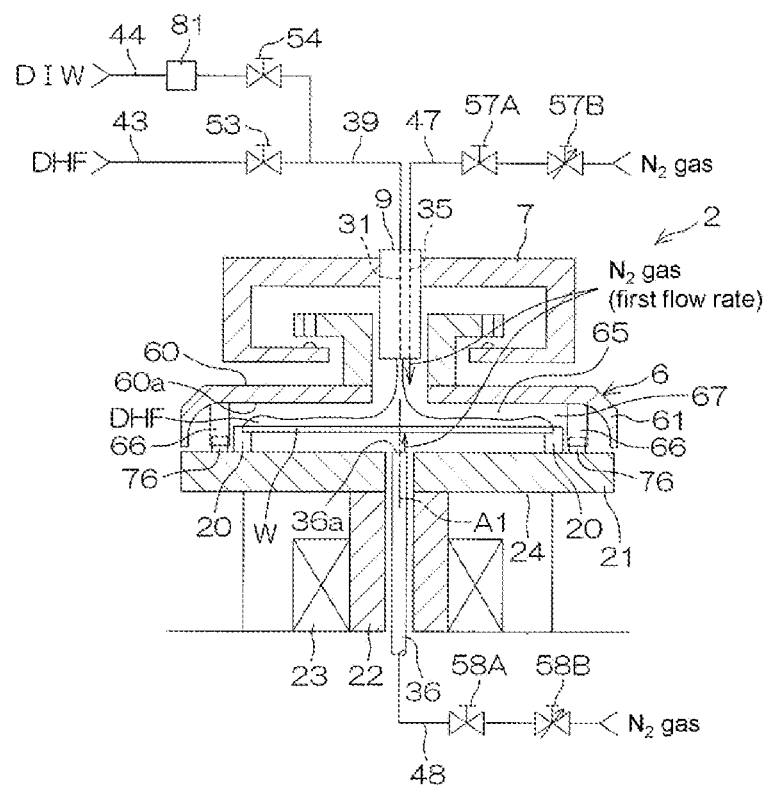

After supply of the first rinse solution to the upper surface of the substrate W continues for a predetermined time (for example, 10 seconds), the first rinse solution valve 52 is closed. Then, the first liquid sending valve 99C (refer to FIG. 4) and the etching solution valve 53 are opened. Thereby, as shown in FIG. 7C, an etching solution (DHF) in the first etching solution tank 90 (refer to FIG. 4) is supplied (discharged) from the second tube 32 of the center nozzle 9 (etching solution nozzle) toward a central area of the upper surface of the substrate W (Step S4: initial etching solution supply process). Therefore, in the initial etching solution supply process, the etching solution having a dissolved oxygen concentration within the first reference concentration range is supplied to the upper surface of the substrate W.

When the etching solution having a dissolved oxygen concentration within the first reference concentration range is supplied to the upper surface of the substrate W, the cobalt oxide layer 154 of the substrate W (refer to FIG. 2) is removed (metal oxide layer removal process, initial metal oxide layer removal process). The dissolved oxygen concentration in the etching solution supplied to the upper surface of the substrate W in the initial metal oxide layer removal process is referred to as an initial dissolved oxygen concentration.

When the etching solution valve 53 is opened, the upper inert gas flow rate adjusting valve 57B and the lower inert gas flow rate adjusting valve 58B are adjusted so that a total flow rate of an inert gas supplied from the fifth tube 35 and the bottom nozzle 36 becomes a first flow rate (for example, 90 L/min). In this manner, the upper inert gas flow rate adjusting valve 57B and the lower inert gas flow rate adjusting valve 58B are an example of a gas flow rate adjusting unit that adjusts a flow rate of an inert gas supplied to the space 65.

When the etching solution is discharged from the second tube 32, the accommodation space 67 (the space 65) is filled with an inert gas. Therefore, in the initial metal oxide layer removal process, the dissolved oxygen concentration (initial dissolved oxygen concentration) in the etching solution on the substrate W is maintained at a concentration within the first reference concentration range.

The etching solution adhered to the upper surface of the substrate W spreads over the entire upper surface of the substrate W due to a centrifugal force. Thereby, the first rinse solution on the substrate W is replaced with the etching solution. The oxidation fluid and the first rinse solution on the substrate W scatter radially outward from the substrate W due to a centrifugal force and are received in the cup 4.

After supply of the etching solution to the upper surface of the substrate W continues for a predetermined time (for example, 10 seconds), the etching solution valve 53 and the first liquid sending valve 99C are closed. On the other hand, the second rinse solution valve 54 is opened. Thereby, the second rinse solution such as DIW is supplied (discharged) from the second tube 32 toward a central area of the upper surface of the substrate W (Step S5: initial second rinse solution supply process). The second rinse solution discharged from the second tube 32 is degassed by the degassing unit 81 (degassing second rinse solution supply process).

The second rinse solution spreads over the entire upper surface of the substrate W due to a centrifugal force. Thereby, the etching solution adhered to the upper surface of the substrate W is washed off with the second rinse solution (degassing second rinsing step). The etching solution and the second rinse solution on the substrate W scatter radially outward from the substrate W due to a centrifugal force and are received in the cup 4. After supply of the second rinse solution to the upper surface of the substrate W continues for a predetermined time (for example, 10 seconds), the second rinse solution valve 54 is closed. Thereby, the initial second rinse solution supply process (Step S5) ends.

When the oxidation fluid supply process (Step S2) to the second rinse solution supply process are performed once (Step S5), the metal oxide layer forming process and the metal oxide layer removal process are performed once (one cycle).

For example, when the oxidation fluid supply process to the second rinse solution supply process are performed three or more times, that is, when the metal oxide layer forming process and the metal oxide layer removal process are performed for three cycles, after the initial second rinse solution supply process (Step S5), the initial oxidation fluid supply process (Step S2) to the initial second rinse solution supply process (Step S5) are performed again a predetermined number of times. Then, the final oxidation fluid supply process (Step S6) to the final second rinse solution supply process (Step S9) are performed once, and after the final second rinse solution supply process (Step S9), the organic agent supply process (Step S10) is performed.

When the oxidation fluid supply process to the second rinse solution supply process are performed twice, that is, when the metal oxide layer forming process and the metal oxide layer removal process are performed for two cycles, after the first initial second rinse solution supply process (Step S5), the final oxidation fluid supply process (Step S6) to the final second rinse solution supply process (Step S9) are performed once without repeating the initial oxidation fluid supply process (Step S2) to the initial second rinse solution supply process (Step S5). Then, the organic agent supply process (Step S10) is performed.

In the final oxidation fluid supply process (Step S6), the final first rinse solution supply process (Step S7), and the final second rinse solution supply process (Step S9), the same processes as the initial oxidation fluid supply process (Step S2), the initial first rinse solution supply process (Step S3) and the initial second rinse solution supply process (Step S5) are performed.

For example, in the final oxidation fluid supply process (Step S6), as in the initial oxidation fluid supply process (Step S2), when the oxidation fluid is supplied to the upper surface of the substrate W, the cobalt wiring 152 of the substrate W is oxidized (refer to FIG. 2). Thereby, the cobalt oxide layer 154 (refer to FIG. 2) is formed (metal oxide layer forming process, final metal oxide layer forming process).

On the other hand, in the final etching solution supply process (Step S8), unlike the initial etching solution supply process (Step S4), the etching solution in the second etching solution tank 100 is supplied to the second tube 32. That is, the second liquid sending valve 109C is opened in place of the first liquid sending valve 99C (refer to FIG. 4). Thereby, the etching solution tank from which the etching solution is supplied to the second tube 32 is switched from the first etching solution tank 90 to the second etching solution tank 100 (tank switching process). When the tank switching process is performed, the dissolved oxygen concentration in the etching solution supplied from the second etching solution tank 100 to the second tube 32 is adjusted (dissolved oxygen concentration adjusting process).

In this manner, the first liquid sending valve 99C and the second liquid sending valve 109C function as a switching unit that switches the etching solution tank from which the etching solution is supplied to the second tube 32 to one of the first etching solution tank 90 and the second etching solution tank 100. The first liquid sending valve 99C and the second liquid sending valve 109C also function as a dissolved oxygen concentration reducing unit that reduces the dissolved oxygen concentration in the etching solution that is supplied to the second tube 32.

Figure 7D:
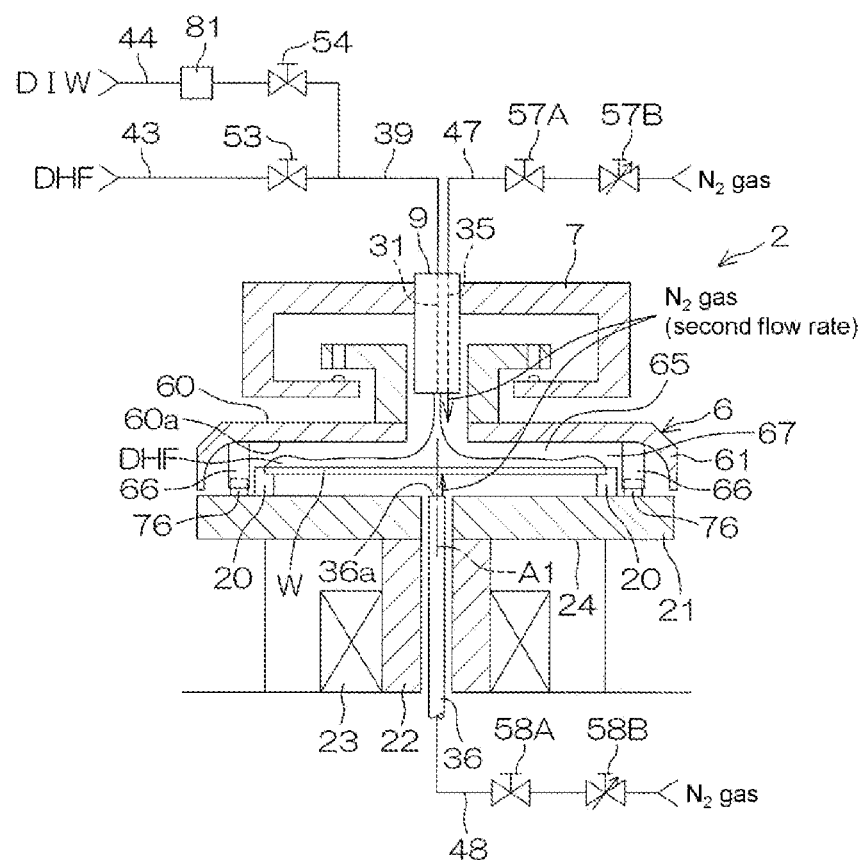

Therefore, as shown in FIG. 7D, the etching solution (DHF) in the second etching solution tank 100 (refer to FIG. 4) is supplied (discharged) from the second tube 32 of the center nozzle 9 (etching solution nozzle) toward a central area of the upper surface of the substrate W (Step S8: final etching solution supply process). In the final etching solution process, the etching solution having a dissolved oxygen concentration within the second reference concentration range is supplied to the upper surface of the substrate W.

When the etching solution having a dissolved oxygen concentration within the second reference concentration range is supplied to the upper surface of the substrate W, the cobalt oxide layer 154 (refer to FIG. 2) of the substrate W is removed (metal oxide layer removal process, final metal oxide layer removal process). The dissolved oxygen concentration in the etching solution supplied to the upper surface of the substrate W in the final metal oxide layer removal process is referred to as a final dissolved oxygen concentration. In the dissolved oxygen concentration adjusting process, the dissolved oxygen concentration in the etching solution supplied to the etching solution nozzle is adjusted so that the final dissolved oxygen concentration is lower than the initial dissolved oxygen concentration.

Discharge of an inert gas from the fifth tube 35 and the bottom nozzle 36 continues from the first initial oxidation fluid supply process (Step S2). Therefore, when the etching solution is discharged from the second tube 32, the accommodation space 67 (the space 65) is filled with an inert gas.

Therefore, the final dissolved oxygen concentration is maintained within the second reference concentration range.

In addition, in the final etching solution supply process (Step S8), the degree of opening of the upper inert gas flow rate adjusting valve 57B and the lower inert gas flow rate adjusting valve 58B are adjusted so that a total flow rate of an inert gas supplied from the fifth tube 35 and the bottom nozzle 36 becomes a second flow rate (for example, 100 L/min) larger than the first flow rate (gas flow rate changing process, gas flow rate adjusting process).

Figure 7E:
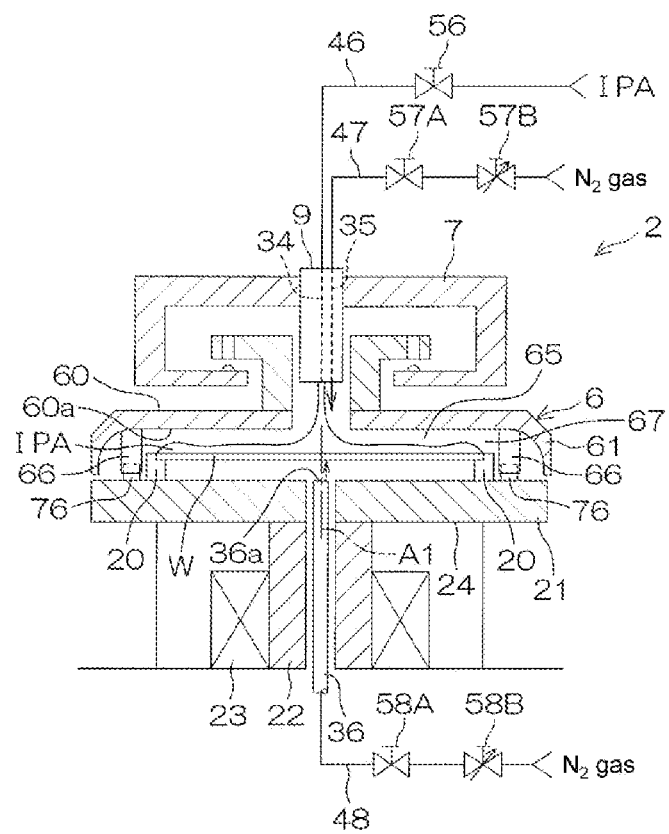

After the final second rinse solution supply process (Step S9) is performed, the organic agent valve 56 is opened. Thereby, as shown in FIG. 7E, an organic agent such as IPA is supplied (discharged) from the fourth tube 34 toward a central area of the upper surface of the substrate W (Step S10: organic agent supply process).

The organic agent spreads over the entire upper surface of the substrate W due to a centrifugal force. The organic agent is mixed with the second rinse solution. Therefore, the second rinse solution on the substrate W is removed from the substrate W together with the newly supplied organic agent. Thereby, the second rinse solution on the substrate W is replaced with the organic agent. The second rinse solution and the organic agent on the substrate W scatter radially outward from the substrate W due to a centrifugal force and are received in the cup 4.

Figure 7F:
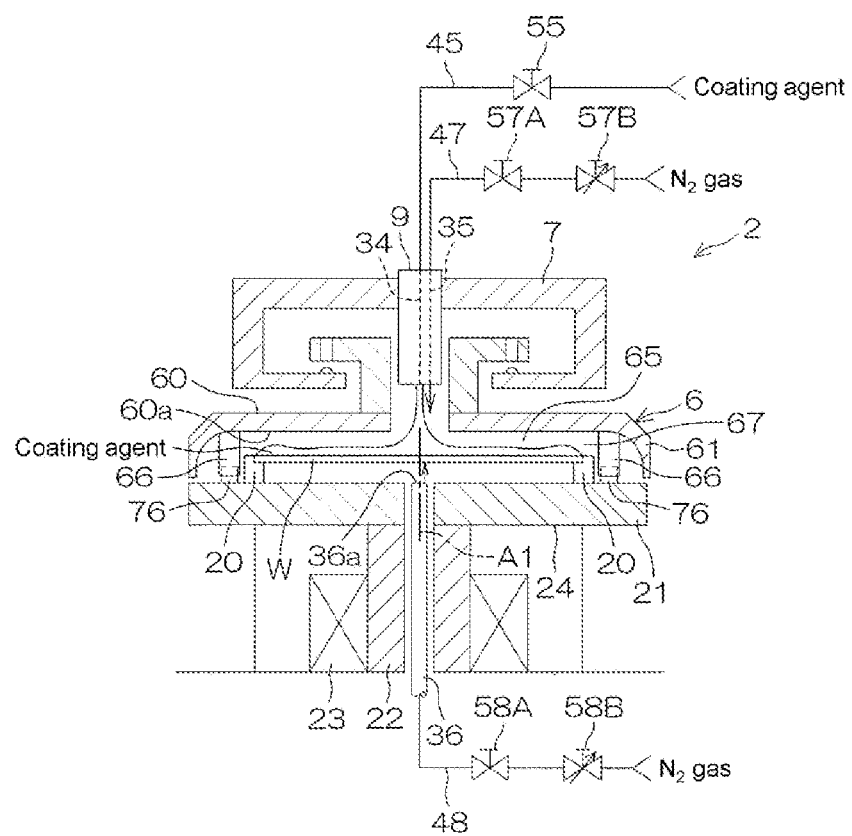

Then, the organic agent valve 56 is closed, and the coating agent valve 55 is opened instead. Thereby, as shown in FIG. 7F, the coating agent is supplied (discharged) from the third tube 33 toward a central area of the upper surface of the substrate W (Step S11: coating agent supply process).

The coating agent spreads over the entire upper surface of the substrate W due to a centrifugal force. The coating agent is mixed with the organic agent. Therefore, the organic agent on the substrate W is removed from the substrate W together with the newly supplied coating agent. Thereby, the organic agent on the substrate W is replaced with the coating agent, and the upper surface of the substrate W is covered with the coating agent. The organic agent and the coating agent on the substrate W scatter radially outward from the substrate W due to a centrifugal force and are received in the cup 4.

Then, the coating agent valve 55 is closed. Thereby, supply of the coating agent to the upper surface of the substrate W is stopped. Then, the organic solvent in the coating agent on the substrate W is evaporated, and thus a coating film is formed on the substrate W. In this case, the substrate W may be heated by a heater (not shown) or the like built into the spin base 21 and thus the organic agent in the coating agent may be evaporated.

Then, the spin motor 23 rotates the substrate W, for example, at 2,000 rpm. Thereby, a liquid component on the substrate W is shaken off, and the substrate W is dried (Step S12: substrate drying process).

Then, the spin motor 23 stops rotation of the spin chuck 5. Then, the upper inert gas valve 57A and the lower inert gas valve 58A are closed. Then, the support member lifting unit 27 moves the support member 7 to the upper position.

Then, as shown in FIG. 1, the transfer robot CR enters the processing unit 2, lifts the processed substrate W from the spin chuck 5 and unloads it to the outside of the processing unit 2 (Step S13: substrate unloading process). The substrate W is transferred from the transfer robot CR to the transfer robot IR and stored in the carrier C by the transfer robot IR.

Figure 8:
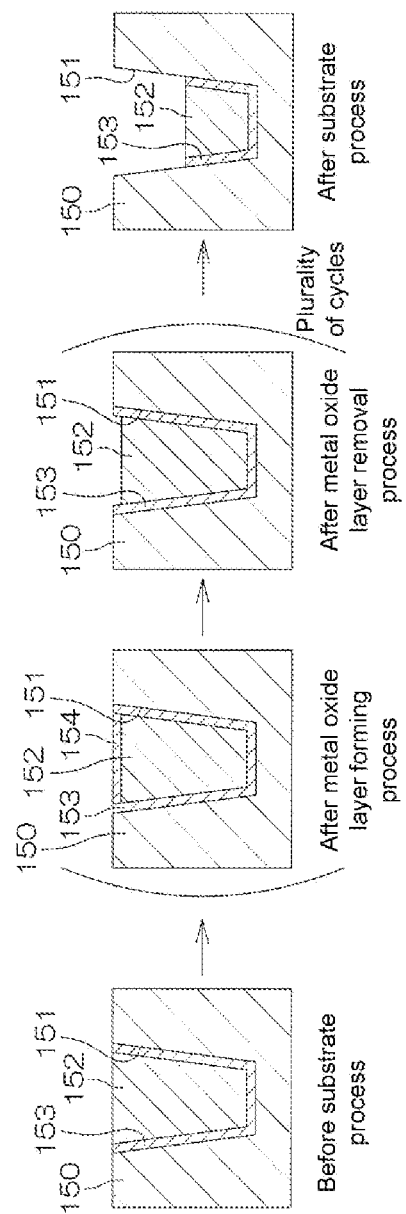
FIG. 8 is a schematic diagram for explaining change in the structure in the vicinity of the surface layer of the substrate according to the substrate process.

In the above substrate process, as shown in FIG. 8, according to the metal oxide layer forming process, the surface layer of the cobalt wiring 152 is oxidized and the cobalt oxide layer 154 is formed. Then, in the metal oxide layer removal process, the cobalt oxide layer 154 is etched. When the metal oxide layer forming process and the metal oxide layer removal process are alternately repeated a plurality of times, the etching amount of the cobalt wiring 152 becomes a desired amount finally. When the metal oxide layer forming process and the metal oxide layer removal process are repeated a plurality of cycles, the barrier layer 153 is also etched as in the cobalt wiring 152.

The change in the state of the surface layer of the cobalt wiring 152 according to the metal oxide layer forming process and the metal oxide layer removal process will be described with reference to FIG. 9. As shown in (a) of FIG. 9 and (b) of FIG. 9, an oxidation fluid such as a hydrogen peroxide solution is supplied to the surface of the substrate W, and thus the cobalt oxide layer 154 (metal oxide layer) composed of a one-atom layer or a several-atom layer is formed on the surface layer of the cobalt wiring 152 (metal layer) (initial metal oxide layer forming process). In the metal oxide layer forming process, the cobalt oxide layer 154 composed of a one-atom layer or a several-atom layer is formed. The thickness of a one-atom layer of cobalt and cobalt oxide is 1 nm or less (for example, 0.3 nm to 0.4 nm). The several-atom layer means a two-atom layer to a ten-atom layer.

Figure 9:
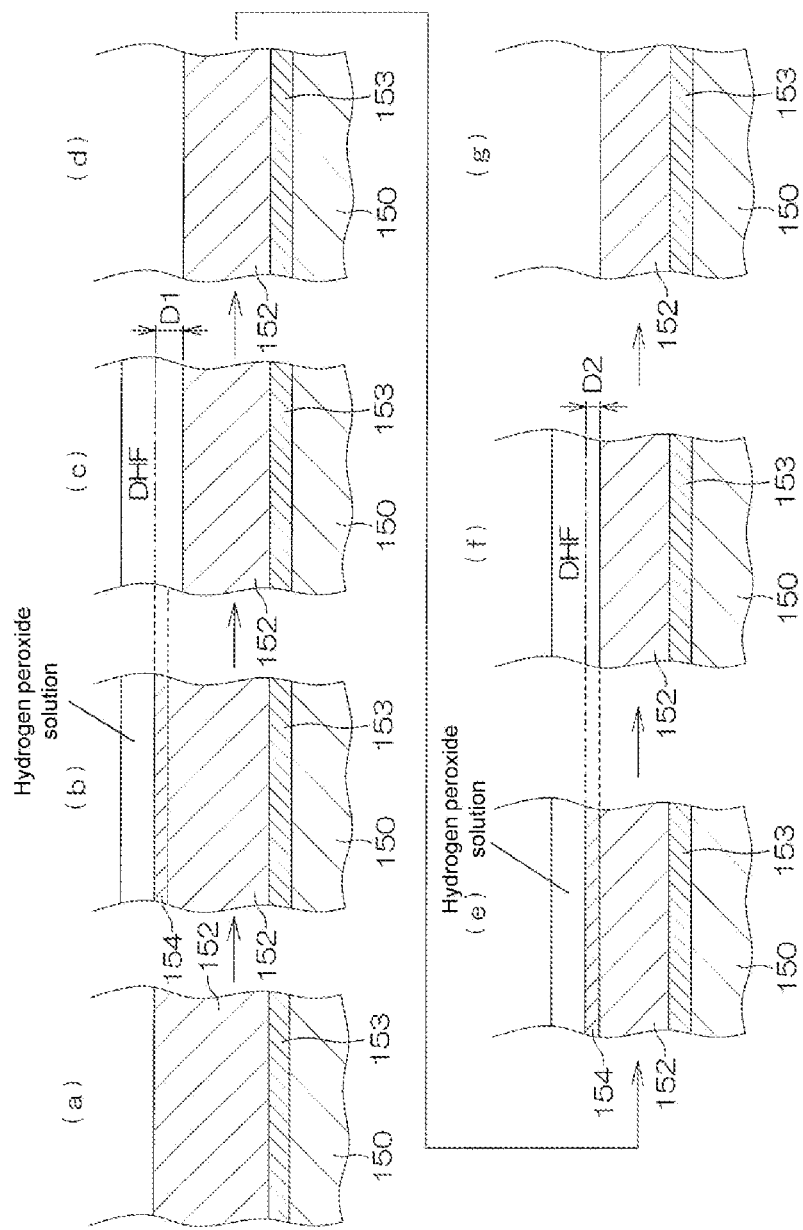
FIG. 9 is a schematic diagram for explaining change in a surface state of a substrate according to performing of an oxidation fluid supply process and an etching solution supply process in the substrate process.

Then, as shown in (c) of FIG. 9 and (d) of FIG. 9, when the etching solution such as a dilute hydrofluoric acid in the first etching solution tank 90 is supplied to the surface of the substrate W, the cobalt oxide layer 154 is removed from the surface of the substrate W (initial metal oxide layer removal process).

In the present embodiment, the initial dissolved oxygen concentration is higher than the final dissolved oxygen concentration. Specifically, the initial dissolved oxygen concentration is within the first reference concentration range (higher than 200 ppb and 500 ppb or less), and the final dissolved oxygen concentration is within the second reference concentration range (0 ppb or more and 200 ppb or less).

As the dissolved oxygen concentration in the etching solution is higher, the cobalt wiring 152 of the surface of the substrate W is oxidized due to dissolved oxygen in the etching solution, the cobalt oxide layer 154 is formed, and a part of the cobalt wiring 152 that is not oxidized by the oxidation fluid is also etched by the etching solution. Therefore, as the dissolved oxygen concentration in the etching solution is higher, an amount of the cobalt wiring 152 etched (etching amount) by performing the metal oxide layer forming process and the metal oxide layer removal process one cycle increases.

In the present embodiment, since the initial dissolved oxygen concentration is higher than the final dissolved oxygen concentration, the amount of the cobalt wiring 152 that is etched by performing the initial metal oxide layer forming process and the initial metal oxide layer removal process one cycle is larger than the amount of the cobalt wiring 152 that is etched by performing the final metal oxide layer forming process and the final metal oxide layer removal process.

Specifically, since the initial dissolved oxygen concentration is within the first reference concentration range (higher than 200 ppb), the thickness (etching amount D1) of the cobalt wiring 152 etched in the initial metal oxide layer removal process is larger than the thickness of the cobalt oxide layer 154 formed by the oxidation fluid in the initial metal oxide layer forming process.

When the etching amount increases by performing the initial metal oxide layer forming process and the initial metal oxide layer removal process one cycle, it is possible to reduce the number of repetitions (the number of cycles) of the metal oxide layer forming process and the metal oxide layer removal process required to achieve a desired etching amount. The etching amount is also called a recess amount or an etching depth.

Here, since the initial dissolved oxygen concentration does not exceed the first reference concentration range (500 ppb or less), the etching amount D1 does not become too large and is about several nanometers. Therefore, even if the initial metal oxide layer removal process is performed a plurality of times, the cobalt wiring 152 is etched with sufficiently high accuracy.

Then, as shown in (e) of FIG. 9, an oxidation fluid such as a hydrogen peroxide solution is supplied to the surface of the substrate W, and thus the cobalt oxide layer 154 composed of a one-atom layer or a several-atom layer is formed on the surface layer of the cobalt wiring 152 (final metal oxide layer forming process). Then, as shown in (f) of FIG. 9 and (g) of FIG. 9, when the etching solution such as a dilute hydrofluoric acid in the second etching solution tank 100 is supplied to the surface of the substrate W, the cobalt oxide layer 154 is removed from the surface of the substrate W (final metal oxide layer removal process).

In the present embodiment, since the initial dissolved oxygen concentration is higher than the final dissolved oxygen concentration, the amount of the cobalt wiring 152 that is etched by performing the final metal oxide layer forming process and the final metal oxide layer removal process is smaller than the amount of the cobalt wiring 152 that is etched by performing the initial metal oxide layer forming process and the initial metal oxide layer removal process one cycle. Therefore, it is possible to improve removal selectivity of the metal oxide layer in the final metal oxide layer removal process.

Specifically, since the final dissolved oxygen concentration is within the second reference concentration range (200 ppb or less), the thickness (etching amount D2) of the cobalt wiring 152 etched in the final metal oxide layer removal process is substantially the same as the thickness of the cobalt oxide layer 154 formed by the oxidation fluid in the final metal oxide layer forming process.

Therefore, when the final metal oxide layer forming process and the final metal oxide layer removal process are performed, the cobalt wiring 152 can be etched with an accuracy of nanometers or less. Thereby, it is possible to adjust a total amount of the cobalt wiring 152 that is etched by performing the metal oxide layer removal process a plurality of times with high accuracy. A method of etching the cobalt wiring 152 in units of one-atom layers or several-atom layers is called atomic layer wet etching (ALWE).

As described above, it is possible to shorten a time required for repeating the metal oxide layer forming process and the metal oxide layer removal process, and it is possible to etch the cobalt wiring 152 with high accuracy.

As the dissolved oxygen concentration in the etching solution is lower, not only selective removal of the cobalt oxide layer 154 is improved but also the surface roughness of the surface of the cobalt wiring 152 exposed after the cobalt oxide layer 154 is removed is reduced. In other words, the flatness of the surface of the cobalt wiring 152 exposed after the cobalt oxide layer 154 is removed is improved. The dissolved oxygen concentration of the etching solution supplied to the upper surface of the substrate W in the final metal oxide layer removal process is within the second reference concentration range (200 ppb or less) and is sufficiently low. Therefore, it is possible to improve the flatness of the surface of the cobalt wiring 152 exposed after the cobalt oxide layer 154 is removed in the final metal oxide layer removal process. That is, it is possible to etch the cobalt wiring 152 with high accuracy.

In addition, according to this embodiment, the etching solution tank from which the etching solution is supplied to the second tube 32 is switched from the first etching solution tank 90 to the second etching solution tank 100 and thus the dissolved oxygen concentration in the etching solution supplied to the second tube 32 is adjusted. Therefore, it is possible to instantaneously change the dissolved oxygen concentration in the etching solution discharged from the second tube 32. Since it is not necessary to change the dissolved oxygen concentration in the etching solution in the first etching solution tank 90 and the dissolved oxygen concentration in the etching solution in the second etching solution tank 100 when the metal oxide layer removal process is repeatedly performed, compared to when the dissolved oxygen concentration in the etching solution in the etching solution tank changes, it is possible to adjust the initial dissolved oxygen concentration and the final dissolved oxygen concentration with high accuracy.

In addition, according to the present embodiment, an inert gas is supplied to the space 65 between the counter member 6 and the substrate W. Therefore, it is possible to reduce the oxygen concentration in the atmosphere present in the space 65. Therefore, it is possible to reduce the variation in the dissolved oxygen concentration in the etching solution on the upper surface of the substrate W caused when the etching solution on the upper surface of the substrate W is exposed to the atmosphere in the space 65. Therefore, it is possible to adjust a total amount of the cobalt wiring 152 that is etched by repeatedly performing the metal oxide layer forming process and the metal oxide layer removal process with higher accuracy.

According to the present embodiment, additionally, when a flow rate of an inert gas supplied to the space 65 between the counter member 6 and the substrate W changes, a flow rate of an inert gas in the final metal oxide layer removal process is made higher than a flow rate of an inert gas in the initial metal oxide layer removal process. Therefore, it is possible to further reduce the increase in the dissolved oxygen concentration in the etching solution on the substrate W caused when the etching solution on the substrate W is exposed to the atmosphere in the space 65 in the final metal oxide layer removal process. Therefore, it is possible to further improve removal selectivity of the cobalt oxide layer 154 in the final metal oxide layer removal process.

In addition, according to this embodiment, the first rinsing step is performed between the metal oxide layer forming process and the metal oxide layer removal process. When the etching solution is supplied to the upper surface of the substrate W while the oxidation fluid remains on the upper surface of the substrate W, there is a risk of the cobalt wiring 152 that is newly exposed by removing the cobalt oxide layer 154 being oxidized by the oxidation fluid remaining on the upper surface of the substrate W. In this case, there is a risk of the etching amount varying. Therefore, when the oxidation fluid on the substrate W is washed off with the first rinse solution such as DIW, it is possible to control the etching amount with high accuracy.

In addition, according to this embodiment, in the first rinsing step, the degassed first rinse solution is supplied to the upper surface of the substrate W (degassing rinse solution supply process). Even if the oxidation fluid is washed off with the first rinse solution, there is a risk of the cobalt wiring 152 that is newly exposed by removing the cobalt oxide layer 154 being oxidized due to dissolved oxygen in the first rinse solution. Therefore, it is possible to reduce oxidation of the cobalt wiring 152 that is newly exposed by removing the cobalt oxide layer 154 using the degassed first rinse solution.

In addition, in this embodiment, the second rinsing step is performed after the metal oxide layer removal process. If the etching solution remains on the upper surface of the substrate W after the cobalt oxide layer 154 is removed, oxygen in the atmosphere around the upper surface of the substrate W is newly dissolved in the etching solution. Therefore, there is a risk of the cobalt wiring 152 that is newly exposed by removing the cobalt oxide layer 154 using the etching solution being oxidized due to the oxygen. In this case, there is a risk of the etching amount varying. Therefore, when the etching solution adhered to the upper surface of the substrate W is washed off with the second rinse solution, it is possible to control the etching amount with high accuracy.

In addition, in this embodiment, after the final second rinse solution supply process (also after the final metal oxide layer removal process ends), a coating film forming process is performed. After the final second rinse solution supply process, there is a risk of the cobalt wiring 152 of the upper surface of the substrate W being oxidized due to oxygen or water in the atmosphere around the substrate W. Therefore, it is possible to protect the cobalt wiring 152 by forming a coating film covering the upper surface of the substrate W.

Cobalt is more easily oxidized than copper. Therefore, when the metal layer is a cobalt layer such as the cobalt wiring 152, the influence of the change in the dissolved oxygen concentration in the etching solution on the etching amount of the metal layer is greater compared to when the metal layer is a copper layer such as a copper wiring. That is, when the metal layer is a cobalt layer, the final dissolved oxygen concentration is made lower than the initial dissolved oxygen concentration, and thus the etching amount of the metal layer in the initial metal oxide layer removal process can be made larger than the etching amount of the metal layer in the final metal oxide layer removal process compared to when the metal layer is a copper layer. Therefore, compared to when the metal layer is a copper layer, it is easy to reduce the number of repetitions of the metal oxide layer forming process and the metal oxide layer removal process.

Figure 10:
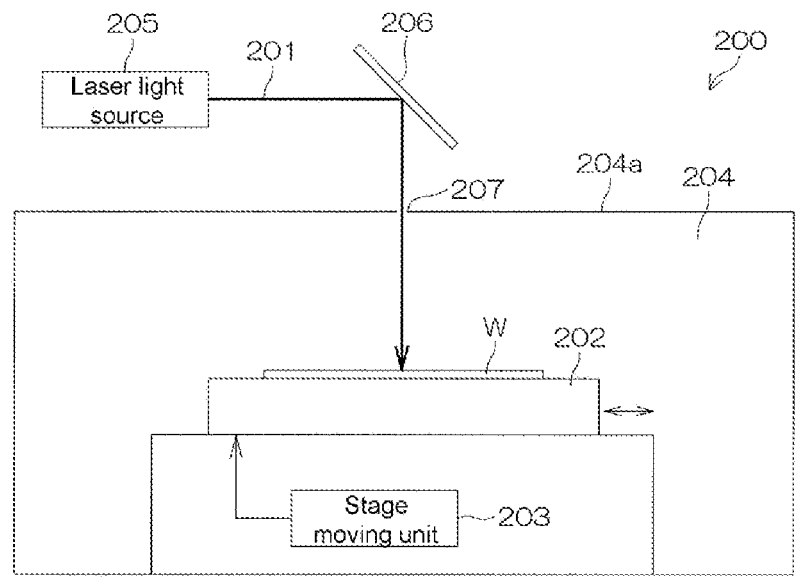
FIG. 10 is a schematic diagram of a laser emitting device that emits a laser to a surface of a substrate.

After the substrate processing device 1 performs the substrate process, a laser thermal anneal (LTA) treatment may be performed on the upper surface of the substrate W using a laser processing device 200 shown in FIG. 10. FIG. 10 is a schematic diagram of the laser processing device 200.

The laser processing device 200 is a device different from the substrate processing device 1. The laser processing device 200 includes a stage 202 on which the substrate W is loaded, a stage moving unit 203 that moves the stage 202 in the horizontal direction, a processing chamber 204 in which the stage 202 is accommodated, a laser light source 205 that generates a laser 201, and a mirror 206 that reflects the laser 201.

The mirror 206 is disposed above a ceiling part 204a of the processing chamber 204. In the ceiling part 204a, a slit 207 for introducing the laser 201 that is reflected by the mirror 206 and directed downward to the processing chamber 204 is formed. In this embodiment, only one mirror 206 is shown, but a plurality of mirrors that reflect the laser 201 generated from the laser light source 205 may be provided.

The laser light source 205 is, for example, an excimer lamp. Regarding the wavelength of the laser 201, for example, an excimer laser of 308 nm is used. The energy density of the laser 201 is preferably 0.2 J/cm$^2$ or more and 0.5 J/cm$^2$ or less.

Next, the LTA treatment will be described. The substrate W on which the substrate process is performed by the substrate processing device 1 is transferred to the processing chamber 204 and loaded on the stage 202. Then, the laser 201 is generated from the laser light source 205 and the laser 201 is emitted to the upper surface of the substrate W. While the laser 201 is emitted to the upper surface of the substrate W, the stage moving unit 203 moves the stage 202 in the horizontal direction, and thus a laser emitting position on the upper surface of the substrate W changes. When the laser 201 is emitted to a predetermined area of the upper surface of the substrate W, the LTA treatment ends. Since a laser emitting process is performed after the substrate process shown in FIG. 6, it is performed after the final metal oxide layer removal process ends.

When the LTA treatment is performed, the surface of the cobalt wiring 152 can be melted by emitting the laser 201. Thereby, the surface of the cobalt wiring 152 can be smoothed.

Since the cobalt wiring 152 is disposed in the trench 151, it is difficult to perform CMP on the surface of the cobalt wiring 152. In such a case, the surface of the cobalt wiring 152 can be smoothed in the LTA treatment.

Here, even if the upper surface of the substrate W is protected with a coating film, the laser 201 can be emitted to the cobalt wiring 152.

In this embodiment, the laser processing device 200 is a device different from the substrate processing device 1. However, unlike this embodiment, the laser processing device 200 may be provided in the substrate processing device 1 as a laser emitting unit.

The disclosure is not limited to the embodiment described above, and can be implemented in other forms.

In the above substrate process, after the organic agent supply process (Step S10), the coating agent supply process (Step S11) is performed. However, unlike the above substrate process, the coating agent supply process (Step S11) may be omitted.

Figure 11:
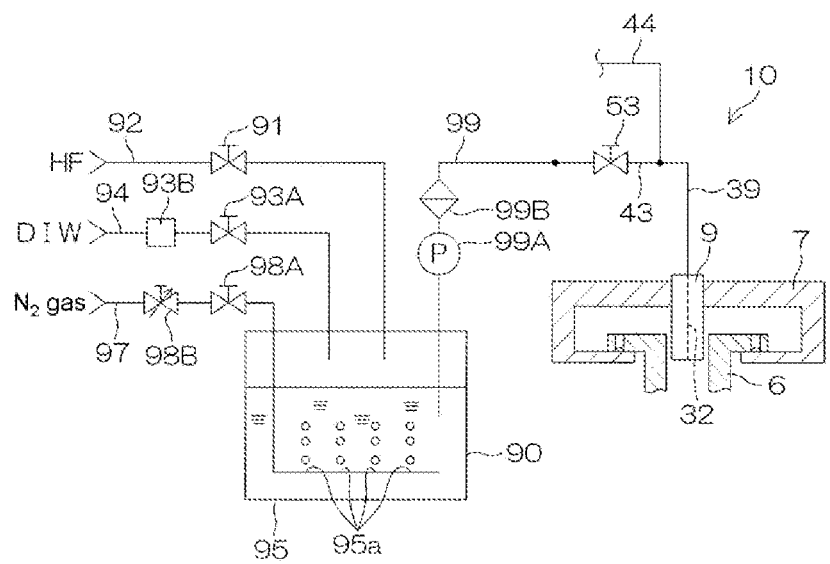
FIG. 11 is a schematic diagram of a modified example of the etching solution supply device.

In addition, in the etching solution supply device 10, the second etching solution tank 100 may not be provided. That is, as shown in FIG. 11, the etching solution supply device 10 may be mainly composed of the first etching solution tank 90, the first stock solution supply pipe 92, the first DIW supply pipe 94, the first etching solution sending pipe 99 and the first bubbling nozzle 95.

In this case, after all the initial etching solution supply processes end, the degree of opening of the first bubbling flow rate adjusting valve 98B is adjusted.

Specifically, before the initial etching solution supply process starts, the first inert gas supplying valve 98A is opened, and an inert gas is supplied from the inert gas supply source to the first bubbling nozzle 95 via the first inert gas supply pipe 97. The inert gas is discharged from the plurality of discharge ports 95a of the first bubbling nozzle 95 and sent to the etching solution in the first etching solution tank 90 (bubbling process).

After all the initial etching solution supply processes end, the degree of opening of the first bubbling flow rate adjusting valve 98B is adjusted so that a flow rate of an inert gas sent to the etching solution in the first etching solution tank 90 in the final etching solution supply process is higher than a flow rate of an inert gas sent to the etching solution in the first etching solution tank 90 in the initial etching solution supply process (bubbling flow rate adjusting process).

When the bubbling flow rate adjusting process is performed, the dissolved oxygen concentration in the etching solution supplied from the first etching solution tank 90 to the second tube 32 is adjusted (dissolved oxygen concentration adjusting process). The first bubbling flow rate adjusting valve 98B functions as a dissolved oxygen concentration reducing unit that reduces the dissolved oxygen concentration in the etching solution supplied to the second tube 32.

Thereby, before the final etching solution supply process starts after all the initial etching solution supply processes end, the dissolved oxygen concentration in the etching solution in the first etching solution tank 90 is adjusted so that the final dissolved oxygen concentration is made lower than the initial dissolved oxygen concentration. Specifically, the dissolved oxygen concentration in the etching solution is adjusted so that the concentration within the first reference concentration range is changed to the concentration within the second reference concentration range.

Therefore, when a plurality of etching solution tanks having different dissolved oxygen concentrations are prepared, and the tanks for the etching solution supplied to the second tube 32 switch, it is possible to reduce a space in which the etching solution tank is disposed compared to when the final dissolved oxygen concentration is lower than the initial dissolved oxygen concentration.

In addition, the etching solution supply device 10 need not necessarily have bubbling units (the first bubbling nozzle 95 and the second bubbling nozzle 105). For example, the degassing unit is provided in the first etching solution sending pipe 99 and the second etching solution sending pipe 109, and dissolved oxygen concentration in the etching solution may be adjusted by the degassing unit.

In addition, in the substrate process described with reference to FIG. 6 and FIG. 7A to FIG. 7F, a substrate on which no barrier layer 153 is provided can also be used.

In addition, in the substrate process described with reference to FIG. 6 and FIG. 7A to FIG. 7F, the final dissolved oxygen concentration is made lower than the dissolved oxygen concentration (all the initial dissolved oxygen concentrations) in the etching solution supplied to the upper surface of the substrate W in all the initial metal oxide layer removal processes. However, the final dissolved oxygen concentration need not necessarily be lower than all the initial dissolved oxygen concentrations and need only be lower than the dissolved oxygen concentration (initial dissolved oxygen concentration) in the etching solution supplied to the upper surface of the substrate W in at least one initial metal oxide layer removal process.

In addition, when the redox potential of the barrier layer is lower than the redox potential of the metal wiring, the barrier layer is easily etched due to dissolved oxygen in the etching solution. Therefore, when the final dissolved oxygen concentration is lower than the initial dissolved oxygen concentration as in the above substrate process, the etching amount of the barrier layer in the final metal oxide layer removal process is smaller than the etching amount of the barrier layer in the initial metal oxide layer removal process. Thereby, the metal layer can be etched with high accuracy. Examples of such a metal include copper and ruthenium.

The redox potential of cobalt is −0.28 V, the redox potential of copper is 0.34 V, and the redox potential of ruthenium is 0.6 V. Therefore, when the metal wiring is a copper wiring and the barrier layer is a cobalt layer or when the metal wiring is a ruthenium wiring and the barrier layer is a copper layer, the redox potential of the barrier layer is lower than the redox potential of the metal wiring.

While the embodiments of the present disclosure have been described in detail, these are only specific examples used for clarifying the technical content of the present disclosure, the present disclosure is not interpreted to be limited to such specific examples, and the scope of the present disclosure is limited by only the scope of appended claims.

Hereinafter, results of an experiment performed to verify etching in units of several nanometers described above will be described with reference to FIG. 12 to FIG. 24.

In FIG. 12 to FIG. 14B, an experiment was performed to measure an etching amount after a substrate was subjected to cycle etching. In this experiment, the etching amount after cycle etching was performed using a single-wafer type substrate washing device (SU-3200 commercially available from SCREEN Semiconductor Solutions Co., Ltd.) was measured.

As the substrate, a substrate having a surface on which a flat copper film was grown to have a thickness of 500 nm by electrochemical deposition (ECD) was used. A natural oxide film formed on the copper film was treated using a dilute hydrofluoric acid (DHF: hydrofluoric acid having about 0.05% concentration) having a dissolved oxygen concentration of 50 ppb or less under an environment of 24° C. for 20 seconds and thus selectively removed. Two types of oxidation fluids were used in order to compare the difference between etching amounts depending on the oxidation fluid. Specifically, under a room temperature environment, a diluted hydrogen peroxide solution ($dH_2O_2$) having a mass percent concentration of about 3% and dilute APM (dAPM) having a mass percent concentration of about 1.2% at room temperature were used. dAPM was a liquid in which ammonia water, a hydrogen peroxide solution, and DIW were mixed at a ratio of about 1:4:100. Regardless of which oxidation fluid was used, dHF was used as the etching solution.

The thickness of the copper film was measured before and after cycle etching and the etching amount was calculated from a difference therebetween. The thickness of the copper film was measured using a sheet resistance device (RS100 commercially available from KLA-Tencor). In addition, the etching amount for each cycle was calculated by dividing a total etching amount calculated from the thickness of the copper film before and after cycle etching by the number of cycles.

Figure 12:
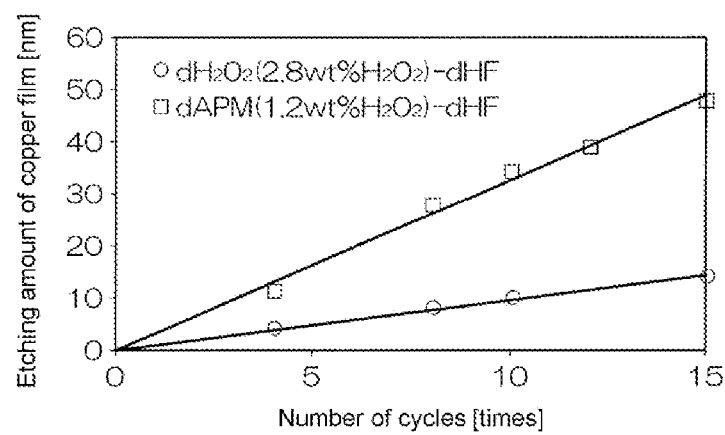
FIG. 12 is a graph showing the relationship between the number of etching cycles and an etching amount of a copper film of a substrate.

FIG. 12 is a graph showing the relationship between the number of etching cycles and the etching amount of the copper film of the substrate. In FIG. 12, the horizontal axis represents the number of cycles. In FIG. 12, the vertical axis represents (total amount) of the etching amount of the copper film. As shown in FIG. 12, both the etching amount of the copper film when dAPM was used and the etching amount of the copper film when $dH_2O_2$ was used were substantially proportional to the number of cycles. However, since the etching amount of the copper film when $dH_2O_2$ was used was more linear than the etching amount of the copper film when dAPM was used, the etching amount of the copper film was thought to be more stable in the case using $dH_2O_2$ than the case using dAPM.

In addition, even if the mass percent concentration (1.2 wt %) of hydrogen peroxide in dAPM was equal to or lower than the half of the mass percent concentration (2.8 wt %) of hydrogen peroxide in $dH_2O_2$, the etching amount of the copper film when dAPM was used was larger than the etching amount of the copper film when $dH_2O_2$ was used.

According to experiment results shown in FIG. 12, in order to reduce the etching amount in the final metal oxide layer removal process, it was preferable to use $dH_2O_2$ rather than dAPM.

Figure 13:
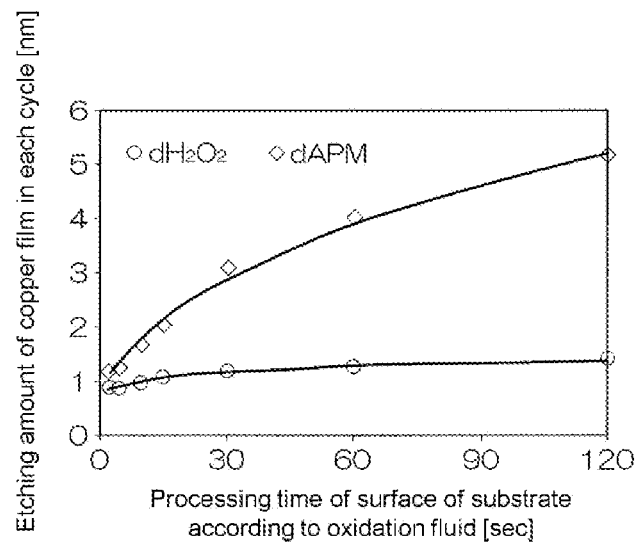
FIG. 13 is a graph showing results obtained by measuring the change in the etching amount of the copper film of the surface of the substrate over time.

Next, in order to know time dependence of acidification of the copper film by the oxidation fluid, the change in the etching amount over time was measured. FIG. 13 is a graph showing results obtained by measuring the change in the etching amount of the copper film of the surface of the substrate over time. In FIG. 13, the horizontal axis represents a processing time of the surface of the substrate according to the oxidation fluid. In FIG. 13, the vertical axis represents the etching amount of the copper film in each cycle.

As shown in FIG. 13, when dAPM was used as the oxidation fluid, the etching amount in each cycle was larger as the processing time was longer. On the other hand, when $dH_2O_2$ was used as the oxidation fluid, the etching amount reached 0.8 nm within about 3 seconds from when the process started. Then, even when the processing time passed, the etching amount hardly increased, and was merely about 1.4 nm when about 120 seconds elapsed from when the process started. A rate of increase of the etching amount with respect to the processing time when $dH_2O_2$ was used as the oxidation fluid was smaller than a rate of increase of the etching amount with respect to the processing time when dAPM was used as the oxidation fluid.

According to experiment results shown in FIG. 13, it was thought that the limit of the etching amount of the copper film due to $dH_2O_2$ in each cycle was about 1.0 nm. Then, it was inferred that, when $dH_2O_2$ was used as the oxidation fluid, it was possible to control the etching amount with high accuracy. Then, it was inferred that the margin of the processing time increased.

Next, in order to know concentration dependence of etching of the copper film by the oxidation fluid, the change in the etching amount with respect to the concentration of hydrogen peroxide in the oxidation fluid was measured.

Figure 14A:
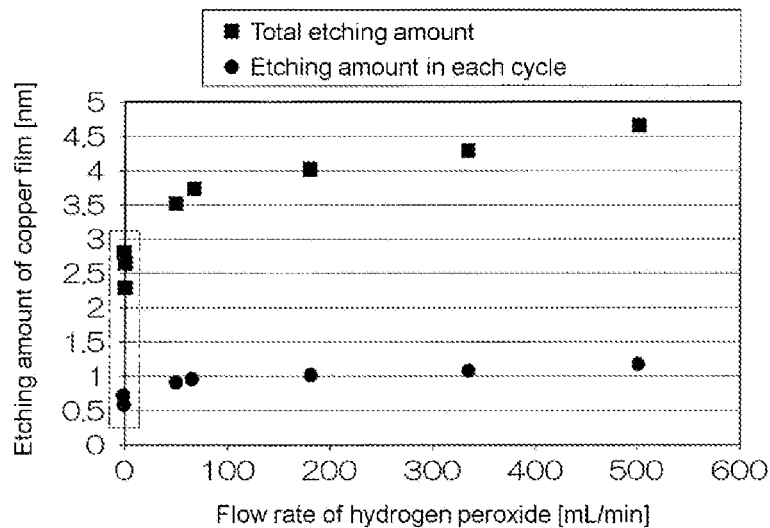
FIG. 14A is a graph showing results obtained by measuring the change in the etching amount of the copper film with respect to a flow rate of hydrogen peroxide.
Figure 14B:
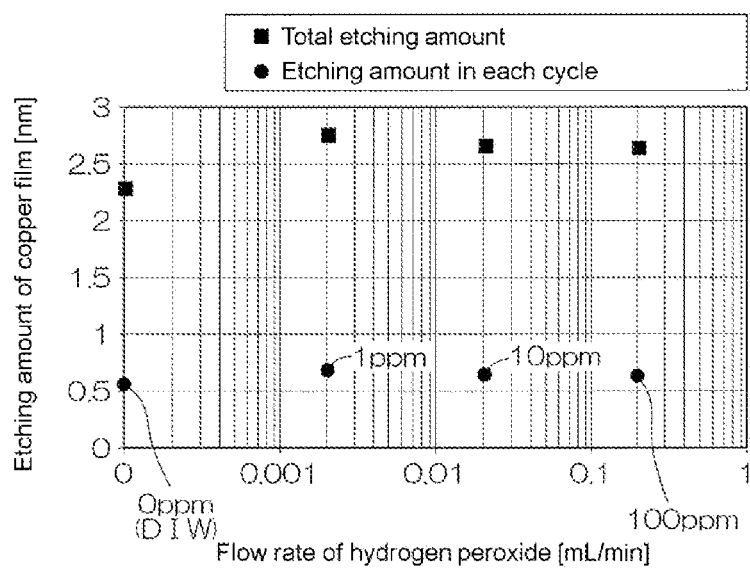
FIG. 14B is a graph showing an enlarged area in which the flow rate of hydrogen peroxide is low in FIG. 14A.

FIG. 14A is a graph showing results obtained by measuring the change in the etching amount of the copper film with respect to a flow rate of hydrogen peroxide. FIG. 14B is a graph obtained by enlarging an area in which the flow rate of hydrogen peroxide was low in FIG. 14A (area indicated by the two dots-dashed line). In FIG. 14A and FIG. 14B, the horizontal axis represents the flow rate of hydrogen peroxide in the oxidation fluid. It was possible to calculate the concentration of hydrogen peroxide in the oxidation fluid from a total flow rate (2 L/min) of the oxidation fluid and a flow rate of hydrogen peroxide. In FIG. 14A and FIG. 14B, the vertical axis represents the etching amount of the copper film. In FIG. 14A and FIG. 14B, both a total etching amount according to cycle etching and the etching amount in each cycle are shown.

As shown in FIG. 14A and FIG. 14B, the etching amount of the copper film hardly changed even when the concentration of hydrogen peroxide in the oxidation fluid changed. Specifically, the etching amount of the copper film in each cycle was about 1.0 nm as long as the concentration of hydrogen peroxide in the oxidation fluid was 1 ppm or more.

According to experiment results shown in FIG. 14A and FIG. 14B, it was found that, when $dH_2O_2$ was used as the oxidation fluid, it was possible to control the etching amount with high accuracy and the margin of the concentration of the oxidant in the oxidation fluid was large.

Figure 15:
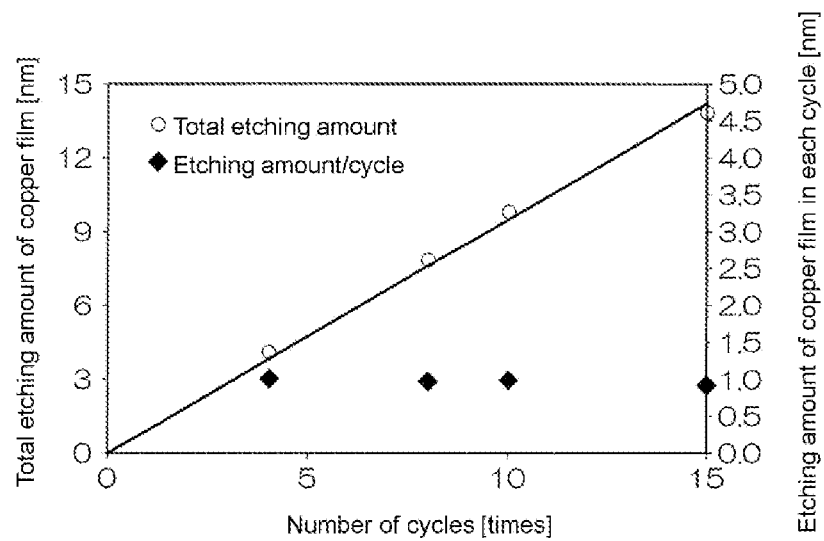
FIG. 15 is a graph showing the relationship between a total etching amount of the copper film according to cycle etching and the etching amount of the copper film in each cycle.

FIG. 15 is a graph showing the relationship between a total etching amount of the copper film according to cycle etching and the etching amount of the copper film in each cycle. In FIG. 15, the horizontal axis represents the number of cycles. In FIG. 15, the vertical axis on the left side represents a total etching amount of the copper film according to cycle etching. In FIG. 15, the vertical axis on the right side represents the etching amount of the copper film in each cycle.

As shown in FIG. 15, regardless of the number of etching cycles, the etching amount of the copper film in each cycle was substantially constant and about 1.0 nm. That is, the etching depth was stable. 1.0 nm corresponds to a length of four copper atoms. That is, in each cycle, a copper oxide layer composed of a four-atom layer (a several-atom layer) was formed from the copper film. In this manner, when $dH_2O_2$ was used, self-aligned oxidation of the copper film was achieved. It was thought that, when oxidation power of the oxidation fluid was adjusted, it was possible to form a copper oxide layer composed of a one-atom layer on the surface of the copper film. It was thought that, when the oxidation fluid having a lower redox potential than $dH_2O_2$ was used, a copper oxide layer composed of a layer of three or less atoms was formed. In addition, it was thought that, when the oxidation fluid having a higher redox potential than $dH_2O_2$ was used, a copper oxide layer composed of a layer of five or more atoms was formed.

Next, an experiment using a substrate in which a copper wiring is disposed in a trench rather than a substrate having a flat copper film on its surface will be described. In this wafer, a pattern was formed at pitches of a half of 22.5 nm. In addition, the trench was formed in the Low-k film, and a Ta/TaN barrier was formed between the copper wiring and the Low-k film. In order to measure a recess amount (etching amount) of the copper wiring in the trench, an atomic force microscope (NanoscopeV commercially available from Veeco), an OCD measuring device (T600 commercially available from Nova), a scanning electron microscope (SEM) (EDR7100 commercially available from KLA-Tencor) and a transmission electron microscope (TEM) (Tecnai F30ST commercially available from FEI) were used. Unless otherwise specified, the other conditions are the same as those in the above experiment.

Figure 16:
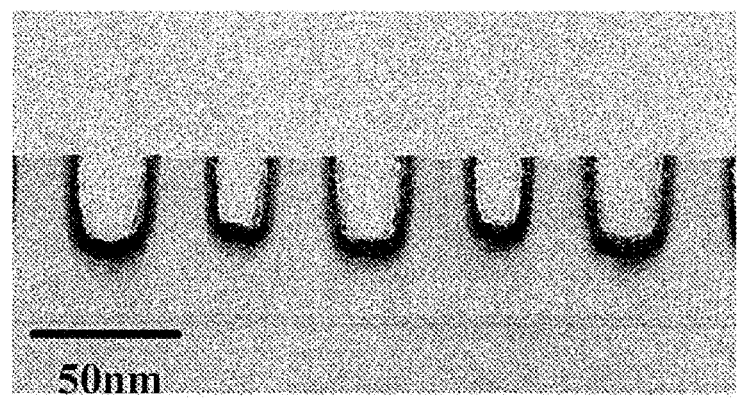
FIG. 16 is a TEM image of a copper wiring after etching using a diluted hydrogen peroxide solution as an oxidation fluid is performed for 10 cycles.

FIG. 16 is a TEM image of a copper wiring after cycle etching using $dH_2O_2$ as the oxidation fluid was performed for 10 cycles. As shown in FIG. 16, despite the depth of the trench being 20 nm to 25 nm, the copper wiring in the trench was completely removed through 10 cycles of cycle etching. When a wafer having a flat copper film was used as a substrate, the thickness of the copper film removed through 10 cycles of cycle etching was about 10 nm (refer to FIG. 15). That is, the etching amount of the copper wiring in the trench in each cycle was 2 to 2.5 times the etching amount of the flat copper film in each cycle.

Figure 17A:
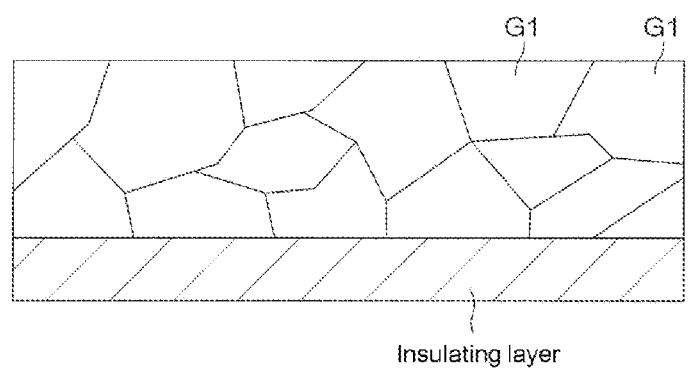
FIG. 17A is a schematic diagram for explaining copper crystal grains in a flat copper film.
Figure 17B:
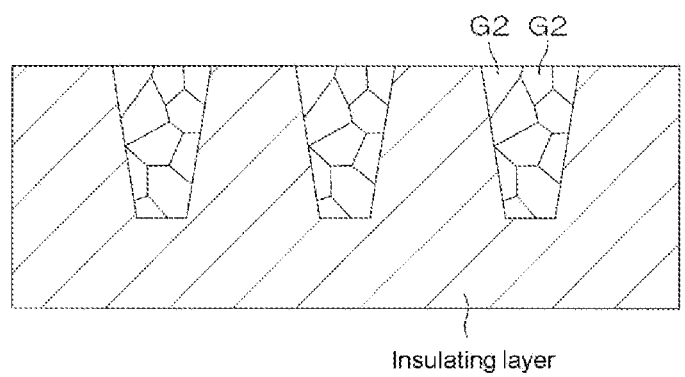
FIG. 17B is a schematic diagram for explaining copper crystal grains in a copper wiring disposed in a trench.

The difference in the thickness of copper etched was thought to be caused by the difference in the sizes of copper crystal grains. Specifically, as shown in FIG. 17A and FIG. 17B, a copper crystal grain G1 in the flat copper film was larger than a crystal grain G2 in the copper wiring in the trench. A wafer having a flat copper film was annealed after the copper film was grown according to ECD. Therefore, crystal grains were united with each other and a crystal grain G1 having a large size was formed.

In the initial stage of oxidation of copper by the oxidation fluid, since a chemical reaction along a boundary between copper crystal grains was predicted, the reaction was thought to proceed easily when the size of crystal grains was small. This was thought of as a principle that the etching amount of the copper wiring in the trench in each cycle became larger than the etching amount of the flat copper film in each cycle. Therefore, it was thought that it was preferable to change the number of etching cycles between when the flat copper film was etched and when the copper wiring in the trench was etched.

Figure 18:
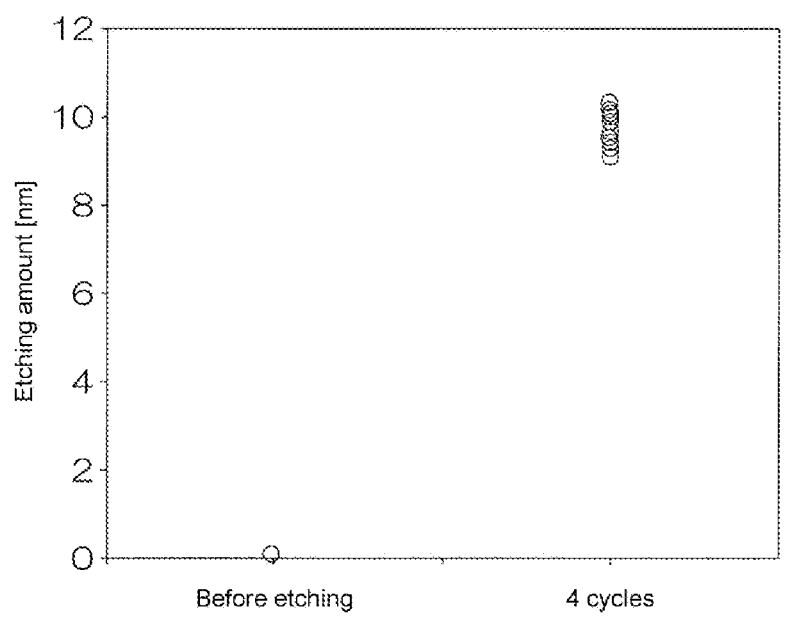
FIG. 18 is a graph showing results obtained by measuring the etching amount after etching using a diluted hydrogen peroxide solution as an oxidation fluid is performed for 4 cycles.

FIG. 18 is a graph showing results obtained by measuring the etching amount after cycle etching using a diluted hydrogen peroxide solution as an oxidation fluid was performed for 4 cycles. FIG. 19A to FIG. 19D are a TEM image and SEM image which show the change in the state of the copper wiring in the trench before and after cycle etching.

Figure 19A:
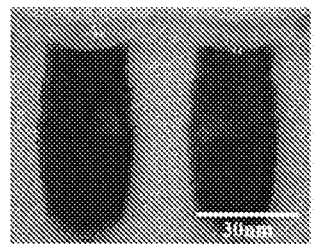
FIG. 19A is a TEM image showing the change in the state of the copper wiring in the trench before cycle etching.
Figure 19B:
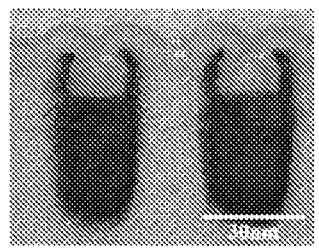
FIG. 19B is a TEM image showing the change in the state of the copper wiring in the trench after cycle etching.
Figure 19C:
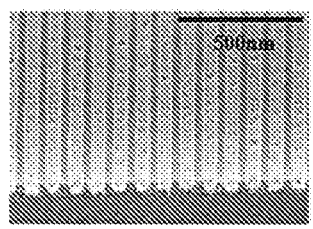
FIG. 19C is an SEM image showing the change in the state of the copper wiring in the trench before cycle etching.
Figure 19D:
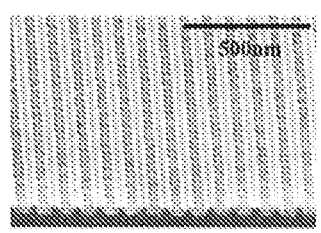
FIG. 19D is an SEM image showing the change in the state of the copper wiring in the trench after cycle etching.

FIG. 19A is a TEM image showing the state of the copper wiring before cycle etching, and FIG. 19B is a TEM image showing the state of the copper wiring after cycle etching (4 cycles). FIG. 19C is an SEM image showing the state of the surface of the copper wiring before cycle etching. FIG. 19D is an SEM image showing the state of the surface of the copper wiring after cycle etching (4 cycles).

As shown in FIG. 18, when cycle etching was performed for 4 cycles, the depth of the recess (the etching amount of the copper wiring) was about 10 nm. This result was substantially the same as in the TEM images shown in FIG. 19A and FIG. 19B. In addition, as shown in FIG. 19C and FIG. 19D, the surface of the copper wiring became rough when cycle etching was performed.

Next, an experiment in which a laser was emitted to the surface of the copper wiring in order to improve the roughness of the surface of the copper wiring in the trench roughened according to cycle etching was performed. In this experiment, a substrate in which the copper wiring was disposed in the trench was used. Unless otherwise specified, the other conditions are the same as those in the above experiment.

In this experiment, first, the LTA treatment was performed on the substrate subjected to cycle etching. The LTA treatment was performed using LT-3000 (commercially available from SCREEN Laser Systems & Solutions of Europe). The energy density using the LTA device was changed from 0 $J/cm^2$ to 0.65 $J/cm^2$.

Figure 20:
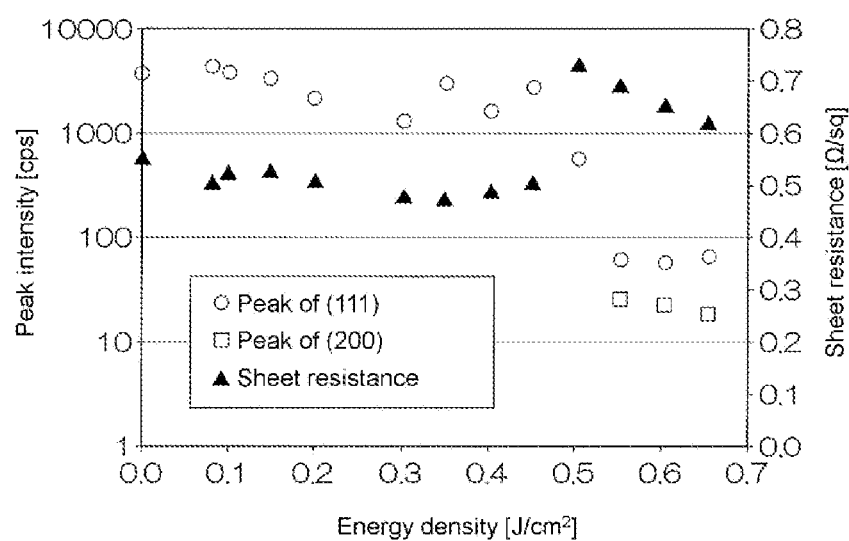
FIG. 20 is a graph obtained by measuring the change in a sheet resistance of the copper wiring and the change in a crystal state with respect to an energy density of a laser emitted to the copper wiring.

First, the influence of the LTA treatment on the crystal state and resistance value of copper was examined. The crystal state of copper was measured using an X-ray diffractometer (JVX7300 commercially available from Bruker). FIG. 20 is a graph obtained by measuring the change in the sheet resistance of the copper wiring and the change in the crystal state with respect to the energy density of a laser emitted to the copper wiring. In FIG. 20, the horizontal axis represents the energy density of a laser. In FIG. 20, the vertical axis on the left side represents the measurement result according to X-ray diffraction (the intensity of the peak indicating each crystal state). In FIG. 20, the vertical axis on the right side represents the sheet resistance.

Before a laser was emitted, the crystal state of copper was (111), and in this case, the sheet resistance of copper was about 0.55 $\Omega$/sq. When the energy density of the laser was increased to a value higher than 0.5 $J/cm^2$, the crystal state of some copper changed to (200), and the sheet resistance of copper increased. Therefore, in consideration of the sheet resistance (resistance value), it was thought that the energy density of the laser was preferably set to 0.5 $J/cm^2$ or less.

Next, the surface state of the copper wiring after the LTA treatment was measured using a scanning electron microscope (SEM) (EDR7100 commercially available from KLA-Tencor). FIG. 21A to FIG. 21D are SEM images showing the surface state of the copper wiring after lasers were emitted at different energy densities. Although the scale of the image was not shown in the SEM images shown in FIG. 21B to FIG. 21D, the SEM images shown in FIG. 21B to FIG. 21D have the same scale as the SEM image shown in FIG. 21A.

Figure 21A:
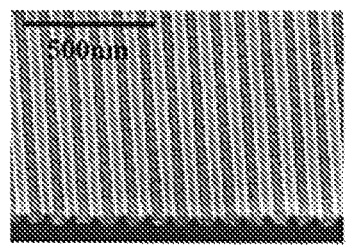
FIG. 21A to FIG. 21D are SEM images showing the surface state of the copper wiring after a laser is emitted.
Figure 21B:
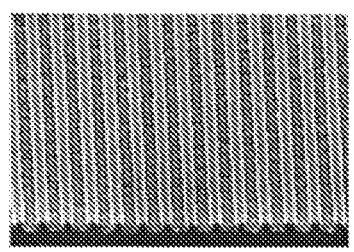
Figure 21C:
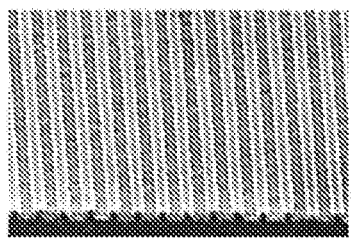
Figure 21D:
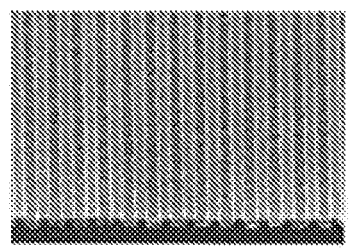

FIG. 21A shows the surface state of the copper wiring before the LTA treatment. FIG. 21B shows the surface state of the copper wiring after a laser having an energy density of 0.15 $J/cm^2$ was emitted. FIG. 21C shows the surface state of the copper wiring after a laser having an energy density of 0.3 $J/cm^2$ was emitted. FIG. 21D shows the surface state of the copper wiring after a laser having an energy density of 0.4 $J/cm^2$ was emitted.

As shown in FIG. 21A and FIG. 21B, when a laser having an energy density of 0.15 $J/cm^2$ was used, the roughness of the surface of the copper wiring was not reduced. On the other hand, as shown in FIG. 21C and FIG. 21D, when a laser having an energy density of 0.30 $J/cm^2$ or 0.40 $J/cm^2$ was used, the roughness of the surface of the copper wiring was reduced.

Figure 22:
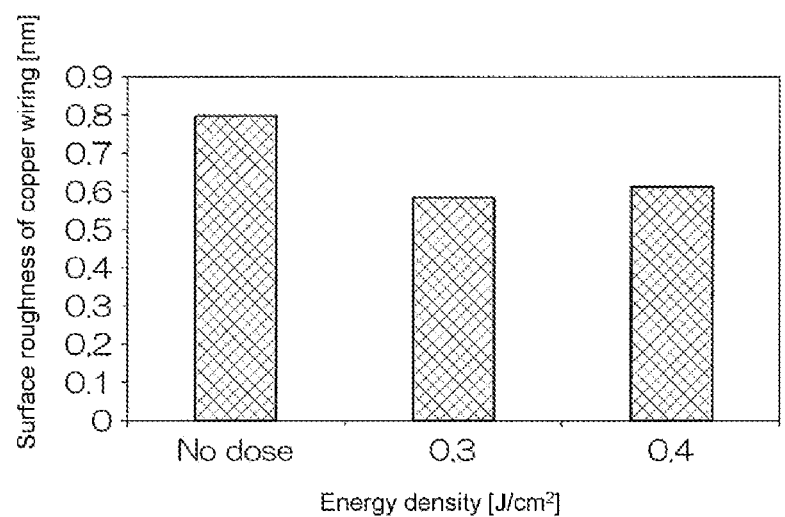
FIG. 22 is a graph showing results obtained by measuring a surface roughness of the copper wiring before and after a laser is emitted using an atomic force microscope.

Then, in order to quantitatively measure reduction in the roughness of the surface of the copper wiring according to the LTA treatment, the surface roughness of the copper wiring was measured using an atomic force microscope (NanoscopeV commercially available from Veeco). FIG. 22 is a graph showing results obtained by measuring a surface roughness of the copper wiring before and after a laser was emitted using an atomic force microscope.

As shown in FIG. 22, the result in which the surface roughness of the copper wiring to which a laser having an energy density of 0.30 $J/cm^2$ to 0.40 $J/cm^2$ was emitted was lower than the surface roughness of the copper wiring to which no laser was emitted was obtained (refer to "No dose" in FIG. 22). That is, when a laser having an energy density of 0.30 $J/cm^2$ or 0.40 $J/cm^2$ was emitted to the surface of the copper wiring, the surface roughness of the copper wiring was reduced.

Next, an experiment using a substrate on which a cobalt film was formed will be described with reference to FIG. 23 and FIG. 24. In the experiment of which the results are shown in FIG. 23 and FIG. 24, the etching amount after cycle etching was performed using a single-wafer type substrate washing device (SU-3200 commercially available from SCREEN Semiconductor Solutions Co., Ltd.) was measured.

Figure 23:
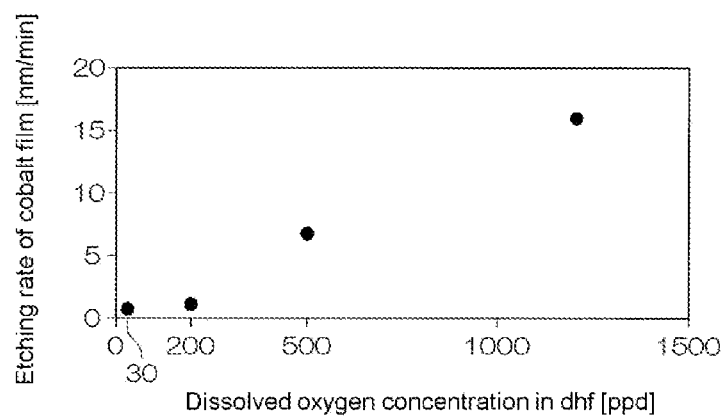
FIG. 23 is a graph showing results obtained by measuring the change in the etching amount of a cobalt wiring with respect to a dissolved oxygen concentration in hydrofluoric acid.
Figure 24:
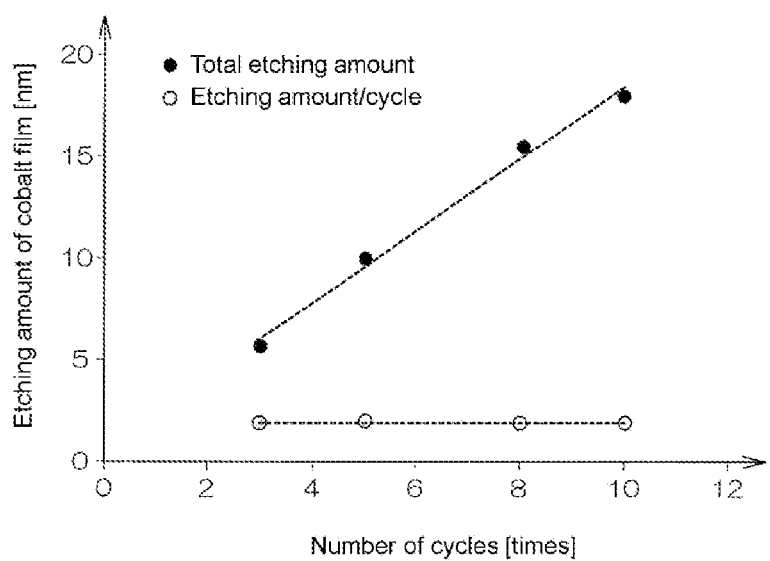
FIG. 24 is a graph showing the relationship between a total etching amount of the cobalt wiring according to cycle etching and the etching amount of the cobalt wiring in each cycle.

In the experiment of which the results are shown in FIG. 23 and FIG. 24, a substrate having a flat cobalt film grown to have a thickness of 100 nm by electrochemical deposition on its surface was used. In these experiments, dAPM was used as the oxidation fluid and dHF (hydrofluoric acid having about 0.05% concentration at room temperature) was used as the etching solution.

The thickness of the cobalt film before and after cycle etching was measured and the etching amount was calculated from its difference. The thickness of the cobalt film was measured using a sheet resistance device (RS100 commercially available from KLA-Tencor). In addition, the etching amount for each cycle was calculated by dividing a total etching amount calculated from the thickness of the cobalt film before and after cycle etching by the number of cycles.

FIG. 23 is a graph showing the results obtained by measuring the change in the etching amount of the cobalt wiring with respect to the dissolved oxygen concentration in hydrofluoric acid. In FIG. 23, the horizontal axis represents a dissolved oxygen concentration in dHF supplied to the substrate. In FIG. 23, the vertical axis represents the etching amount of the cobalt film.

As shown in FIG. 23, the etching amount (etching rate) of the cobalt film per minute when dHF having a dissolved oxygen concentration of 30 ppb was used as the etching solution was about 0.5 nm.

The etching rate of the cobalt film when dHF having a dissolved oxygen concentration of 200 ppb was used as the etching solution was about 1 nm. The etching rate of the cobalt film when dHF having a dissolved oxygen concentration of 500 ppb was used as the etching solution was about 7 nm. The etching rate of the cobalt film when dHF having a dissolved oxygen concentration of 1,200 ppb was used as the etching solution was about 16 nm.

In this manner, the etching rate of the cobalt film significantly changed according to the dissolved oxygen concentration in dHF. In addition, it was thought that, when the dissolved oxygen concentration in dHF was 200 ppb or less, the etching rate was significantly low and oxidation of the cobalt film due to dissolved oxygen in dHF hardly occurred. That is, it was thought that, when dHF having a dissolved oxygen concentration of 200 ppb or less was used as the etching solution, it was possible to etch the cobalt film with high accuracy. "200 ppb or less" means 0 ppb or more and 200 ppb or less.

It was thought that, even if dHF having a dissolved oxygen concentration of larger than 200 ppb and 500 ppb or less was used as the etching solution, since the etching rate was several nm/min, it was possible to etch the cobalt film with sufficiently high accuracy.

On the other hand, it was thought that, when dHF having a dissolved oxygen concentration of larger than 500 ppb was used as the etching solution, since the etching rate was several tens of nm/min, it was not possible to etch the cobalt film with sufficiently high accuracy.

FIG. 24 is a graph showing the relationship between a total etching amount of the cobalt wiring according to cycle etching and the etching amount of the cobalt wiring in each cycle. In FIG. 24, the horizontal axis represents the number of cycles. In FIG. 24, the vertical axis represents the etching amount of the cobalt wiring according to cycle etching.

As shown in FIG. 24, regardless of the number of etching cycles, the etching amount of the cobalt film in each cycle was substantially constant and about 1.9 nm. That is, the etching depth was stable. 1.9 nm corresponds to a length of 5 to 6 cobalt atoms. That is, in each cycle, a cobalt oxide layer composed of a 5- to 6-atom layer (several-atom layer) was formed from the cobalt film. In this manner, self-aligned oxidation of the cobalt film was achieved as in the copper film.

The disclosure provides a substrate processing method in which a substrate having a metal layer on its surface is processed. The substrate processing method includes a metal oxide layer forming process in which an oxidation fluid is supplied to a surface of the substrate and a metal oxide layer composed of a one-atom layer or a several-atom layer is formed on a surface layer of the metal layer; and a metal oxide layer removal process in which an etching solution is supplied to the surface of the substrate and the metal oxide layer is removed from the surface of the substrate. In the substrate processing method, the metal oxide layer forming process and the metal oxide layer removal process are alternately performed a plurality of times. In the substrate processing method, a final dissolved oxygen concentration which is a dissolved oxygen concentration in the etching solution supplied to the surface of the substrate in a final metal oxide layer removal process that is finally performed among the metal oxide layer removal processes performed a plurality of times is lower than an initial dissolved oxygen concentration which is a dissolved oxygen concentration in the etching solution supplied to the substrate in an initial metal oxide layer removal process that is performed before the final metal oxide layer removal process.

According to this method, in one metal oxide layer forming process, a metal oxide layer composed of a one-atom layer or a several-atom layer is formed. The thickness of a one-atom layer of a metal and a metal oxide is 1 nm or less (for example, 0.3 nm to 0.4 nm). Therefore, when the metal oxide layer is selectively removed in the metal oxide layer removal process, it is possible to control the etching amount of the metal layer with an accuracy of nanometers or less.

As the dissolved oxygen concentration in the etching solution is higher, the metal layer on the surface of the substrate is oxidized due to dissolved oxygen in the etching solution and a metal oxide layer is easily formed, and accordingly, a part of the metal layer that is not oxidized by the oxidation fluid is easily etched using the etching solution. Therefore, as the dissolved oxygen concentration in the etching solution is higher, an amount of the metal layer etched by performing the metal oxide layer forming process and the metal oxide layer removal process once (etching amount) increases.

Therefore, when the initial dissolved oxygen concentration is higher than the final dissolved oxygen concentration, the etching amount according to the initial metal oxide layer removal process is larger than the etching amount according to the final metal oxide layer removal process. When the etching amount according to the initial metal oxide layer removal process increases, it is possible to reduce the number of repetitions of the metal oxide layer forming process and the metal oxide layer removal process required to achieve a desired etching amount.

When the etching amount according to the final metal oxide layer removal process is smaller than the etching amount according to the initial metal oxide layer removal process, it is possible to improve removal selectivity of the metal oxide layer in the final metal oxide layer removal process. Therefore, it is possible to adjust a total amount of the metal layer that is etched by repeating the metal oxide layer forming process and the metal oxide layer removal process with high accuracy.

As a result, it is possible to shorten a time required for repeating the metal oxide layer forming process and the metal oxide layer removal process and it is possible to etch the metal layer with high accuracy.

In one embodiment of the disclosure, the final dissolved oxygen concentration is 200 ppb or less. When the final dissolved oxygen concentration is set to 200 ppb or less, it is possible to control the etching amount of the metal layer in the final metal oxide layer removal process with higher accuracy.

In one embodiment of the disclosure, the metal oxide layer removal process includes a process in which an etching solution in an etching solution tank is discharged from an etching solution nozzle toward the surface of the substrate. In addition, the substrate processing method further includes a dissolved oxygen concentration adjusting process in which a dissolved oxygen concentration in an etching solution supplied from the etching solution tank to the etching solution nozzle is adjusted so that the final dissolved oxygen concentration is lower than the initial dissolved oxygen concentration.

In one embodiment of the disclosure, the etching solution tank includes a first etching solution tank in which an etching solution having a first dissolved oxygen concentration is stored and a second etching solution tank in which an etching solution having a second dissolved oxygen concentration that is lower than the first dissolved oxygen concentration is stored. In addition, the dissolved oxygen concentration adjusting process includes a tank switching process in which the etching solution tank from which an etching solution is supplied to the etching solution nozzle is switched from the first etching solution tank to the second etching solution tank so that the etching solution is supplied from the first etching solution tank to the etching solution nozzle in the initial metal oxide layer removal process and the etching solution is supplied from the second etching solution tank to the etching solution nozzle in the final metal oxide layer removal process.

According to this method, when the etching solution tank from which an etching solution is supplied to the etching solution nozzle is switched from the first etching solution tank to the second etching solution tank, it is possible to change the dissolved oxygen concentration in the etching solution discharged from the etching solution nozzle. Compared to when the dissolved oxygen concentration in the etching solution is adjusted by changing the dissolved oxygen concentration in the etching solution in the etching solution tank, it is possible to switch the dissolved oxygen concentration in the etching solution quickly and it is possible to adjust the initial dissolved oxygen concentration and the final dissolved oxygen concentration with high accuracy.

In one embodiment of the disclosure, the dissolved oxygen concentration adjusting process includes a bubbling process in which an inert gas is sent to the etching solution in the etching solution tank and a bubbling flow rate adjusting process in which a flow rate of an inert gas sent to the etching solution in the etching solution tank is adjusted so that a flow rate of an inert gas sent to the etching solution in the etching solution tank in the final metal oxide layer removal process is higher than a flow rate of an inert gas sent to the etching solution in the etching solution tank in the initial metal oxide layer removal process.

According to this method, the dissolved oxygen concentration in the etching solution supplied from the etching solution tank to the etching solution nozzle is adjusted so that a flow rate of an inert gas sent into the etching solution tank is adjusted and thus the final dissolved oxygen concentration is lower than the initial dissolved oxygen concentration. Compared to when a plurality of etching solution tanks in which etching solutions having different dissolved oxygen concentrations are stored are switched, it is possible to reduce a space in which the etching solution tank is disposed.

In one embodiment of the disclosure, the substrate processing method further includes an inert gas supply process in which an inert gas is supplied to a space between a counter member that faces the surface of the substrate and the substrate before at least the metal oxide layer removal process starts.

According to this method, an inert gas is supplied to a space between the counter member and the substrate. Therefore, it is possible to reduce the oxygen concentration in the atmosphere present in the space. Therefore, it is possible to reduce the variation in the dissolved oxygen concentration in the etching solution on the surface of the substrate caused when the etching solution on the surface of the substrate is exposed to the atmosphere in the space. Therefore, it is possible to adjust a total amount of the metal layer that is etched by repeating the metal oxide layer forming process and the metal oxide layer removal process with higher accuracy.

In one embodiment of the disclosure, the substrate processing method further includes a gas flow rate changing process in which a flow rate of an inert gas supplied to the space changes so that a flow rate of an inert gas in the final metal oxide layer removal process is higher than a flow rate of an inert gas in the initial metal oxide layer removal process.

According to this method, when a flow rate of an inert gas supplied into a space between the counter member and the substrate changes, a flow rate of an inert gas in the final metal oxide layer removal process is made higher than a flow rate of an inert gas in the initial metal oxide layer removal process. Therefore, in the final metal oxide layer removal process, it is possible to further reduce the increase in the dissolved oxygen concentration in the etching solution on the surface of the substrate caused when the etching solution on the surface of the substrate is exposed to the atmosphere in the space. Therefore, it is possible to further improve removal selectivity of the metal oxide layer in the final metal oxide layer removal process.

In one embodiment of the disclosure, the substrate processing method further includes a degassing rinse processing which is performed between the metal oxide layer forming process and the metal oxide layer removal process and in which a degassed rinse solution is supplied to the surface of the substrate, and an oxidation fluid adhered to the surface of the substrate is washed off.

When a rinse solution is supplied to the surface of the substrate, there is a risk of a metal layer newly exposed by removing the metal oxide layer being oxidized due to dissolved oxygen in the rinse solution. Therefore, it is possible to reduce oxidation of the metal layer according to supply of the rinse solution using the degassed rinse solution.

In one embodiment of the disclosure, the metal layer includes a cobalt layer. Cobalt is more easily oxidized than copper. Therefore, when the metal layer is a cobalt layer, the influence of the change in the dissolved oxygen concentration in the etching solution on the etching amount of the metal layer is greater compared to when the metal layer is made of copper. That is, when the metal layer is a cobalt layer, the final dissolved oxygen concentration is made lower than the initial dissolved oxygen concentration, and thus the etching amount of the metal layer in the initial metal oxide layer removal process can be made larger than the etching amount of the metal layer in the final metal oxide layer removal process compared to when the metal layer is made of copper. Therefore, compared to when the metal layer is made of copper, it is easy to reduce the number of repetitions of the metal oxide layer forming process and the metal oxide layer removal process.

In one embodiment of the disclosure, the substrate has an insulating layer in which a trench is formed. The metal layer includes a wiring formed in the trench and a barrier layer that is formed to follow the trench between the wiring and the insulating layer. In addition, a redox potential of the barrier layer is lower than a redox potential of the wiring.

When a redox potential of the barrier layer is lower than a redox potential of the wiring, the barrier layer is easily etched due to dissolved oxygen in the etching solution. In addition, when the final dissolved oxygen concentration is lower than the initial dissolved oxygen concentration, the etching amount of the barrier layer in the final metal oxide layer removal process is smaller than the etching amount of the barrier layer in the initial metal oxide layer removal process. Thereby, the metal layer can be etched with high accuracy.

One embodiment of the disclosure provides a substrate processing device including an oxidation fluid nozzle from which an oxidation fluid is discharged toward a surface of a substrate having a metal layer on its surface; an etching solution tank in which an etching solution is stored; an etching solution nozzle from which an etching solution is discharged toward a surface of the substrate; a dissolved oxygen concentration reducing unit that reduces a dissolved oxygen concentration in an etching solution that is supplied from the etching solution tank to the etching solution nozzle; and a controller that controls the oxidation fluid nozzle, the etching solution nozzle, and the dissolved oxygen concentration reducing unit.

The controller is programmed to alternately perform a metal oxide layer forming process in which a metal oxide layer composed of a one-atom layer or a several-atom layer is formed on a surface layer of the metal layer by discharging an oxidation fluid from the oxidation fluid nozzle toward the surface of the substrate and a metal oxide layer removal process in which the metal oxide layer is removed from the surface of the substrate by discharging an etching solution from the etching solution nozzle toward the surface of the substrate a plurality of times.

In addition, the controller is programmed to perform a dissolved oxygen concentration adjusting process in which a dissolved oxygen concentration in an etching solution supplied to the etching solution nozzle is adjusted by the dissolved oxygen concentration reducing unit so that a final dissolved oxygen concentration which is a dissolved oxygen concentration in the etching solution supplied to the surface of the substrate in a final metal oxide layer removal process that is finally performed among the metal oxide layer removal processes performed a plurality of times is lower than an initial dissolved oxygen concentration which is a dissolved oxygen concentration in the etching solution supplied to the substrate in an initial metal oxide layer removal process that is performed before the final metal oxide layer removal process.

According to this device, in one metal oxide layer forming process, a metal oxide layer composed of a one-atom layer or a several-atom layer is formed. The thickness of a one-atom layer of a metal and a metal oxide is 1 nm or less (for example, 0.3 nm to 0.4 nm). Therefore, when the metal oxide layer is selectively removed in the metal oxide layer removal process, it is possible to control the etching amount of the metal layer with an accuracy of nanometers or less.

As the dissolved oxygen concentration in the etching solution is higher, the metal layer on the surface of the substrate is oxidized due to dissolved oxygen in the etching solution and a metal oxide layer is more easily formed, and accordingly, a part of the metal layer that is not oxidized by the oxidation fluid is easily etched using the etching solution. Therefore, as the dissolved oxygen concentration in the etching solution is higher, the amount of the metal layer that is etched by performing the metal oxide layer forming process and the metal oxide layer removal process once increases.

Therefore, when the initial dissolved oxygen concentration is higher than the final dissolved oxygen concentration, the etching amount according to the initial metal oxide layer removal process is larger than the etching amount according to the final metal oxide layer removal process. When the etching amount according to the initial metal oxide layer removal process increases, it is possible to reduce the number of repetitions of the metal oxide layer forming process and the metal oxide layer removal process required to achieve a desired etching amount.

When the etching amount according to the final metal oxide layer removal process is smaller than the etching amount according to the initial metal oxide layer removal process, it is possible to improve removal selectivity of the metal oxide layer in the final metal oxide layer removal process. Therefore, it is possible to adjust a total amount of the metal layer that is etched by repeating the metal oxide layer forming process and the metal oxide layer removal process with high accuracy.

As a result, it is possible to shorten a time required for repeating the metal oxide layer forming process and the metal oxide layer removal process and it is possible to etch the metal layer with high accuracy.

In one embodiment of the disclosure, the final dissolved oxygen concentration is 200 ppb or less. When the final dissolved oxygen concentration is set to 200 ppb or less, it is possible to control the etching amount of the metal layer in the final metal oxide layer removal process with higher accuracy.

In one embodiment of the disclosure, the etching solution tank includes a first etching solution tank in which an etching solution having a first dissolved oxygen concentration is stored and a second etching solution tank in which an etching solution having a second dissolved oxygen concentration that is lower than the first dissolved oxygen concentration is stored. In addition, the substrate processing device further includes a switching unit that switches the etching solution tank from which an etching solution is supplied to the etching solution nozzle to one of the first etching solution tank and the second etching solution tank.

In addition, in the dissolved oxygen concentration adjusting process, the controller is programmed to perform a tank switching process in which the etching solution tank from which an etching solution is supplied to the etching solution nozzle is switched from the first etching solution tank to the second etching solution tank so that an etching solution is supplied from the first etching solution tank to the etching solution nozzle in the initial metal oxide layer removal process and an etching solution is supplied from the second etching solution tank to the etching solution nozzle in the final metal oxide layer removal process.

According to this device, when the etching solution tank from which an etching solution is supplied to the etching solution nozzle is switched from the first etching solution tank to the second etching solution tank, it is possible to change the dissolved oxygen concentration in the etching solution discharged from the etching solution nozzle. Compared to when the dissolved oxygen concentration in the etching solution is adjusted by changing the dissolved oxygen concentration in the etching solution in the etching solution tank, it is possible to switch the dissolved oxygen concentration in the etching solution quickly and it is possible to adjust the initial dissolved oxygen concentration and the final dissolved oxygen concentration with high accuracy.

In one embodiment of the disclosure, the dissolved oxygen concentration reducing unit includes a bubbling unit that sends an inert gas to an etching solution in the etching solution tank and a bubbling flow rate adjusting unit that adjusts a flow rate of an inert gas that is sent from the bubbling unit.

In addition, the controller is programmed to perform a bubbling process in which an inert gas is sent from the bubbling unit to an etching solution in the etching solution tank and a bubbling flow rate adjusting process in which the bubbling flow rate adjusting unit is controlled to adjust a flow rate of an inert gas sent from the bubbling unit to an etching solution in the etching solution tank so that a flow rate of an inert gas sent to the etching solution in the etching solution tank in the final metal oxide layer removal process is higher than a flow rate of an inert gas sent to the etching solution in the etching solution tank in the initial metal oxide layer removal process.

According to this device, the dissolved oxygen concentration in the etching solution supplied from the etching solution tank to the etching solution nozzle is adjusted so that a flow rate of an inert gas sent into the etching solution tank is adjusted and thus the final dissolved oxygen concentration is lower than the initial dissolved oxygen concentration. Compared to when a plurality of etching solution tanks in which etching solutions having different dissolved oxygen concentrations are stored are switched, it is possible to reduce a space in which the etching solution tank is disposed.

In one embodiment of the disclosure, the substrate processing device further includes a counter member that faces the surface of the substrate; and an inert gas supply unit that supplies an inert gas toward a space between the counter member and the substrate. In addition, the controller is programmed to perform an inert gas supply process in which an inert gas is supplied to the space before at least the metal oxide layer removal process starts.

According to this device, an inert gas is supplied to a space between the counter member and the substrate. Therefore, it is possible to reduce the oxygen concentration in the atmosphere present in the space. Therefore, it is possible to reduce the variation in the dissolved oxygen concentration in the etching solution on the surface of the substrate caused when the etching solution on the surface of the substrate is exposed to the atmosphere in the space. Therefore, it is possible to adjust a total amount of the metal layer that is etched by repeating the metal oxide layer forming process and the metal oxide layer removal process with higher accuracy.

In one embodiment of the disclosure, the substrate processing device further includes a gas flow rate adjusting unit that adjusts a flow rate of an inert gas supplied from the inert gas supply unit to the space. In addition, the controller is programmed to perform a gas flow rate changing process in which the gas flow rate adjusting unit is controlled and a flow rate of an inert gas supplied to the space changes so that a flow rate of an inert gas in the final metal oxide layer removal process is higher than a flow rate of an inert gas in the initial metal oxide layer removal process.

According to this device, when a flow rate of an inert gas supplied into a space between the counter member and the substrate changes, a flow rate of an inert gas in the final metal oxide layer removal process is made higher than a flow rate of an inert gas in the initial metal oxide layer removal process. Therefore, in the final metal oxide layer removal process, it is possible to further reduce the increase in the dissolved oxygen concentration in the etching solution on the surface of the substrate caused when the etching solution on the surface of the substrate is exposed to the atmosphere in the space. Therefore, it is possible to further improve removal selectivity of the metal oxide layer in the final metal oxide layer removal process.

In one embodiment of the disclosure, the substrate processing device further includes a degassing rinse solution supply unit that supplies a degassed rinse solution to the surface of the substrate. In addition, the controller is programmed to perform a degassing rinse process in which the degassed rinse solution is supplied from the degassing rinse solution supply unit to the surface of the substrate and thus an oxidation fluid adhered to the surface of the substrate is washed off between the metal oxide layer forming process and the metal oxide layer removal process.

When a rinse solution is supplied to the surface of the substrate, there is a risk of a metal layer newly exposed by removing the metal oxide layer being oxidized due to dissolved oxygen in the rinse solution. Therefore, it is possible to reduce oxidation of the metal layer according to supply of the rinse solution using the degassed rinse solution.

In one embodiment of the disclosure, the metal layer includes a cobalt layer. Cobalt is more easily oxidized than copper. Therefore, when the metal layer is a cobalt layer, the influence of the change in the dissolved oxygen concentration in the etching solution on the etching amount of the metal layer is greater compared to when the metal layer is made of copper. That is, when the metal layer is a cobalt layer, the final dissolved oxygen concentration is made lower than the initial dissolved oxygen concentration, and thus the etching amount of the metal layer in the initial metal oxide layer removal process can be made larger than the etching amount of the metal layer in the final metal oxide layer removal process compared to when the metal layer is made of copper. Therefore, compared to when the metal layer is made of copper, it is easy to reduce the number of repetitions of the metal oxide layer forming process and the metal oxide layer removal process.

In one embodiment of the disclosure, the substrate has an insulating layer in which a trench is formed. The metal layer includes a wiring formed in the trench and a barrier layer that is formed to follow the trench between the wiring and the insulating layer. In addition, a redox potential of the barrier layer is lower than a redox potential of the wiring.

When a redox potential of the barrier layer is lower than a redox potential of the wiring, the barrier layer is easily etched due to dissolved oxygen in the etching solution. In addition, when the final dissolved oxygen concentration is lower than the initial dissolved oxygen concentration, the etching amount of the barrier layer in the final metal oxide layer removal process is smaller than the etching amount of the barrier layer in the initial metal oxide layer removal process. Thereby, the metal layer can be etched with high accuracy.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A substrate processing method in which a substrate having a metal layer on its surface is processed, comprising:
    a metal oxide layer forming process in which an oxidation fluid is supplied to a surface of the substrate and a metal oxide layer composed of a one-atom layer or a several-atom layer is formed on a surface layer of the metal layer; and
    a metal oxide layer removal process in which an etching solution is supplied to the surface of the substrate and the metal oxide layer is removed from the surface of the substrate, wherein the etching solution is an acidic chemical liquid containing at least one of dilute hydrofluoric acid, hydrochloric acid, acetic acid, citric acid, and glycolic acid,
wherein the metal oxide layer forming process and the metal oxide layer removal process are alternately performed a plurality of times, and
a final dissolved oxygen concentration which is a dissolved oxygen concentration in the etching solution supplied to the surface of the substrate in a final metal oxide layer removal process that is finally performed among the metal oxide layer removal processes performed a plurality of times is lower than an initial dissolved oxygen concentration which is a dissolved oxygen concentration in the etching solution supplied to the substrate in an initial metal oxide layer removal process that is performed before the final metal oxide layer removal process.

2. The substrate processing method according to claim 1, wherein the final dissolved oxygen concentration is 200 ppb or less.

3. The substrate processing method according to claim 1, further comprising
a dissolved oxygen concentration adjusting process in which a dissolved oxygen concentration in an etching solution supplied from an etching solution tank to an etching solution nozzle is adjusted so that the final dissolved oxygen concentration is lower than the initial dissolved oxygen concentration,
wherein the metal oxide layer removal process comprises a process in which the etching solution in the etching solution tank is discharged from the etching solution nozzle toward the surface of the substrate.

4. The substrate processing method according to claim 3, wherein the etching solution tank comprises a first etching solution tank in which an etching solution having a first dissolved oxygen concentration is stored and a second etching solution tank in which an etching solution having a second dissolved oxygen concentration that is lower than the first dissolved oxygen concentration is stored, and
the dissolved oxygen concentration adjusting process comprises a tank switching process in which the etching solution tank from which an etching solution is supplied to the etching solution nozzle is switched from the first etching solution tank to the second etching solution tank so that the etching solution is supplied from the first etching solution tank to the etching solution nozzle in the initial metal oxide layer removal process and the etching solution is supplied from the second etching solution tank to the etching solution nozzle in the final metal oxide layer removal process.

5. The substrate processing method according to claim 3, wherein the dissolved oxygen concentration adjusting process comprises a bubbling process in which an inert gas is sent to the etching solution in the etching solution tank and a bubbling flow rate adjusting process in which a flow rate of an inert gas sent to the etching solution in the etching solution tank is adjusted so that a flow rate of an inert gas sent to the etching solution in the etching solution tank in the final metal oxide layer removal process is higher than a flow rate of an inert gas sent to the etching solution in the etching solution tank in the initial metal oxide layer removal process.

6. The substrate processing method according to claim 1, further comprising an inert gas supply process in which an inert gas is supplied to a space between a counter member that faces the surface of the substrate and the substrate before at least the metal oxide layer removal process starts.

7. The substrate processing method according to claim 6, further comprising a gas flow rate changing process in which a flow rate of an inert gas supplied to the space changes so that a flow rate of an inert gas in the final metal oxide layer removal process is higher than a flow rate of an inert gas in the initial metal oxide layer removal process.

8. The substrate processing method according to claim 1, further comprising a degassing rinse process which is performed between the metal oxide layer forming process and the metal oxide layer removal process and in which a degassed rinse solution is supplied to the surface of the substrate, and an oxidation fluid adhered to the surface of the substrate is washed off.

9. The substrate processing method according to claim 1, wherein the metal layer comprises a cobalt layer.

10. The substrate processing method according to claim 1,
wherein the substrate has an insulating layer in which a trench is formed,
the metal layer comprises a wiring formed in the trench and a barrier layer that is formed to follow the trench between the wiring and the insulating layer, and
a redox potential of the barrier layer is lower than a redox potential of the wiring.

11. A substrate processing method in which a substrate having a metal layer on its surface is processed, comprising:
a metal oxide layer forming process in which an oxidation fluid is supplied to a surface of the substrate and a metal oxide layer composed of a one-atom layer or a several-atom layer is formed on a surface layer of the metal layer; and
a metal oxide layer removal process in which an etching solution is supplied to the surface of the substrate and the metal oxide layer is removed from the surface of the substrate,
wherein the metal oxide layer forming process and the metal oxide layer removal process are alternately performed a plurality of times, and
a final dissolved oxygen concentration which is a dissolved oxygen concentration in the etching solution supplied to the surface of the substrate in a final metal oxide layer removal process that is finally performed among the metal oxide layer removal processes performed a plurality of times is lower than an initial dissolved oxygen concentration which is a dissolved oxygen concentration in the etching solution supplied to the substrate in an initial metal oxide layer removal process that is performed before the final metal oxide layer removal process,
wherein the initial dissolved oxygen concentration is higher than 200 ppb and 500 ppb or less, and the final dissolved oxygen concentration is 200 ppb or less.

12. The substrate processing method according to claim 11, further comprising
a dissolved oxygen concentration adjusting process in which a dissolved oxygen concentration in an etching solution supplied from an etching solution tank to an etching solution nozzle is adjusted so that the final dissolved oxygen concentration is lower than the initial dissolved oxygen concentration,
wherein the metal oxide layer removal process comprises a process in which the etching solution in the etching solution tank is discharged from the etching solution nozzle toward the surface of the substrate.

13. The substrate processing method according to claim 12, wherein the etching solution tank comprises a first etching solution tank in which an etching solution having a first dissolved oxygen concentration is stored and a second etching solution tank in which an etching solution having a second dissolved oxygen concentration that is lower than the first dissolved oxygen concentration is stored, and the dissolved oxygen concentration adjusting process comprises a tank switching process in which the etching solution tank from which an etching solution is supplied to the etching solution nozzle is switched from the first etching solution tank to the second etching solution tank so that the etching solution is supplied from the first etching solution tank to the etching solution nozzle in the initial metal oxide layer removal process and the etching solution is supplied from the second etching solution tank to the etching solution nozzle in the final metal oxide layer removal process.

14. The substrate processing method according to claim 12, wherein the dissolved oxygen concentration adjusting process comprises a bubbling process in which an inert gas is sent to the etching solution in the etching solution tank and a bubbling flow rate adjusting process in which a flow rate of an inert gas sent to the etching solution in the etching solution tank is adjusted so that a flow rate of an inert gas sent to the etching solution in the etching solution tank in the final metal oxide layer removal process is higher than a flow rate of an inert gas sent to the etching solution in the etching solution tank in the initial metal oxide layer removal process.

15. The substrate processing method according to claim 11, further comprising an inert gas supply process in which an inert gas is supplied to a space between a counter member that faces the surface of the substrate and the substrate before at least the metal oxide layer removal process starts.

16. The substrate processing method according to claim 15, further comprising a gas flow rate changing process in which a flow rate of an inert gas supplied to the space changes so that a flow rate of an inert gas in the final metal oxide layer removal process is higher than a flow rate of an inert gas in the initial metal oxide layer removal process.

17. The substrate processing method according to claim 11, further comprising a degassing rinse process which is performed between the metal oxide layer forming process and the metal oxide layer removal process and in which a degassed rinse solution is supplied to the surface of the substrate, and an oxidation fluid adhered to the surface of the substrate is washed off.

18. The substrate processing method according to claim 11, wherein the metal layer comprises a cobalt layer.

19. The substrate processing method according to claim 11,
wherein the substrate has an insulating layer in which a trench is formed,
the metal layer comprises a wiring formed in the trench and a barrier layer that is formed to follow the trench between the wiring and the insulating layer, and
a redox potential of the barrier layer is lower than a redox potential of the wiring.

* * * * *